(12) United States Patent
Ishii

(10) Patent No.: US 6,794,858 B2
(45) Date of Patent: Sep. 21, 2004

(54) RECEIVING LEVEL MEASURING CIRCUIT

(75) Inventor: Takahito Ishii, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 29 days.

(21) Appl. No.: 10/378,871

(22) Filed: Mar. 5, 2003

(65) Prior Publication Data
US 2003/0169030 A1 Sep. 11, 2003

(30) Foreign Application Priority Data

Mar. 7, 2002 (JP) .................................. P. 2002-061522
May 24, 2002 (JP) .................................. P. 2002-150434

(51) Int. Cl.[7] .................. G01R 25/00; H04B 17/00
(52) U.S. Cl. .................. 324/76.78; 455/226.1
(58) Field of Search .................. 324/76.78, 76.11, 324/76.12, 76.19; 455/522, 226.1, 226.2, 226.3

(56) References Cited

U.S. PATENT DOCUMENTS 6,034,952 A * 3/2000 Dohi et al. .................. 370/335

2001/0012766 A1 * 8/2001 Ichikawa .................. 455/69

FOREIGN PATENT DOCUMENTS

JP 2001-285209 10/2001

* cited by examiner

Primary Examiner—N. Le
Assistant Examiner—Amy He
(74) Attorney, Agent, or Firm—Jacobson Holman PLLC

(57) ABSTRACT

A receiving level measuring circuit, which is capable of improving measuring accuracy of a receiving level by correcting phase rotation caused by a frequency error between oscillators included in a transmitter and a receiver and by inhibiting an inappropriate correction when no desirable wave exists and is adapting to a receiver configuration having a plurality of antennas (branches), wherein a desirable/interference wave detection unit detects a frequency error vector, an adder, a frequency error averaging unit, and an arctangent operation unit add up and average the frequency error vectors and performs a unit conversion of the resultant value, a frequency error correction table previously stores a correction value corresponding to the frequency error so as to get the correction value corresponding to the frequency error, an adder adds up a plurality of desirable wave components, and a frequency error correction unit corrects the desirable wave component by using the correction value.

9 Claims, 9 Drawing Sheets

FIG.3

| | P1 | P2 | P3 | P4 | |

Sample frame format

Relationship between amplitude phase variations before and after averaging

Schematic diagram of desirable wave component detected in baseband and RSSI detected in radio unit

RECEIVING LEVEL MEASURING CIRCUIT

BACKGROUND OF THE INVENTION

1. Field of the Invention

The present invention relates to a receiving level measuring circuit for use in a receiver of a mobile communication system, and more particularly to a receiving level measuring circuit capable of improving measuring accuracy of a receiving level and of meeting the specifications for the use of a receiver having a plurality of branches.

2. Description of the Related Art

In a mobile communication system, various multiple access methods have been invented to utilize resources of limited frequencies or the like, and a CDMA (direct sequence-code division multiple access) method is receiving attention.

In the CDMA method, particularly in a DS-CDMA (direct sequence code division multiple access) method in which individual spread codes are allocated to channels to be used for communications so as to be multiplexed and a pilot symbol is inserted into a transmission symbol before transmission while an amplitude phase variation is extracted from a despread signal of the pilot symbol and used to correct the received symbol for demodulation at a receiving end, it is known that there is a need for measuring a level of a received wave in a receiver in order to perform a closed-loop control type transmission power control that is characteristic of the DS-CDMA method.

A conventional general receiving level measurement for a level measurement of a received wave comprises detecting an RSSI (a received signal strength indicator) of a received-signal in a radio frequency band that has already been input to a receiver and calculating a dB value of the RSSI.

First, a sample structure of a receiving level measuring circuit in the conventional CDMA receiver will be described with reference to FIG. 9. Referring to FIG. 9, there is shown a block diagram illustrating a sample structure of the conventional receiving level measuring circuit.

As shown in FIG. 9, the conventional receiving level measuring circuit comprises an RSSI detection unit 1, an analog-to-digital conversion unit (shown as an A–D unit) 2, an RSSI averaging unit 3, and a voltage/dB conversion unit 4.

The following describes components of the conventional receiving level measuring circuit.

The RSSI detection unit 1 is used to detect a received signal strength indicator (RSSI) of a received signal in a radio frequency band and to output the voltage. Note that this unit is implemented in a commercially available RSSI detection IC.

The analog-to-digital conversion unit 2 is used to convert an RSSI analog value whose voltage has been output to a digital value.

The RSSI averaging unit 3 is used to average the detected RSSI.

The voltage/dB conversion unit 4 is used to convert the averaged RSSI voltage to a dB vale. Note that the function of this unit is implemented by previously generating a conversion table of the RSSI voltage versus the RSSI dB value and referencing it.

The following describes an operation of the conventional level measuring circuit with reference to FIG. 9.

In the conventional level measuring circuit, a received signal in a radio frequency band input to a receiver is input to the RSSI detection unit 1, an RSSI of the received signal is detected and output as an analog voltage value, the analog value is converted to a digital value in the analog-to-digital conversion unit 2, the value is submitted to a given averaging process in the RSSI averaging unit 3 and then converted to a dB value in the voltage/dB conversion unit 4, and a result of measuring the receiving level of the signal input to the receiver is output as an RSSI dB value.

This enables a measurement of a quality of receiving the signal input to the receiver.

The above conventional receiving level measuring circuit, however, has a problem that the signals input to the receiver are not always at desirable wave levels since a plurality of transmitters and receivers use an identical radio frequency band for communications in the DS-CDMA method, by which they are measured simply as receiving levels despite the fact that interference wave levels are included.

In addition, the RSSI measurement in the radio frequency band has a problem that it is impossible to measure levels lower than or equal to an in-band noise of a radio unit of the receiver in a theoretical sense, thereby disabling accurate measurement of receiving levels at all levels.

To solve these problems, there has been offered a technology titled "Receiving level measuring method and receiving level measuring circuit" (Applicant: Hitachi Kokusai Electric Inc., Inventor: Takahito Ishii) in Japanese Unexamined Patent Publication (Kokai) No. 285209 of 2001 laid open to public inspection on Oct. 12, 2001.

This conventional technology is a receiving level measuring method and a receiving level measuring circuit for detecting a field strength of a received signal, detecting a desirable wave and an interference wave for each spread code from a baseband signal through a quadrature detection, synthesizing a plurality of desirable wave components with each other to convert them into electricity, correcting the synthesized desirable wave level by adding a reception field strength detected in the radio unit if the reception field strength is more than the in-band noise while using the desirable wave level directly if the reception field strength is lower than or equal to the in-band noise, and considering it to be a result of the receiving level measurement.

The conventional technology in the above, the receiving level measuring-circuit in Japanese Unexamined Patent Publication No. 285209 of 2001 has a basic configuration enabling a measurement of a desirable wave receiving level up to a level lower than or equal to the in-band noise of the receiver radio unit since the measuring circuit separates and measures the desirable level and interference wave level and uses the desirable wave power level as a desirable wave receiving level if the reception field strength is a specific value or below (in-band noise or below) or corrects the desirable wave power level by adding the field strength level to the desirable wave power level and considers the corrected value to be a desirable wave receiving level if the reception field strength is more than the specific value (more than the in-band noise).

SUMMARY OF THE INVENTION

It is an object of the present invention to provide a receiving level measuring circuit capable of improving measuring accuracy of a receiving level by correcting phase rotation caused by a frequency error between oscillators included in a transmitter and a receiver and by inhibiting an inappropriate correction in situations that no desirable wave exists.

It is another object of the present invention to provide a receiving level measuring circuit adapting to a receiver configuration having a plurality of antennas (branches).

In accordance with one aspect of the present invention, there is provided a receiving level measuring circuit, comprising: received signal strength indicator (RSSI) detection means for detecting a field strength of a received signal, quadrature detection means for performing a quadrature detection of the received signal, desirable/interference wave detection means for detecting a plurality of desirable wave components, a plurality of interference wave components, and a plurality of frequency error vectors from the received signal submitted to the quadrature detection, frequency error correction-value acquisition means for previously storing a correction value corresponding to the frequency error and then adding and averaging the plurality of frequency error vectors detected by the desirable/interference wave detection means so as to get the correction value corresponding to the frequency error submitted to a unit conversion, frequency error correction means for adding the plurality of desirable wave components detected by the desirable/interference wave detection means and for correcting the desirable wave components using the correction value, desirable wave. component electricity conversion means for converting the corrected desirable wave components into electricity to get a desirable wave power level, and desirable wave level correction means for outputting the desirable wave power level as a desirable wave receiving level if the detected field strength is lower than or equal to a predetermined specific value or for correcting the desirable wave power level by adding the detected field strength level thereto and then outputting the corrected level as a desirable wave receiving level if the detected field strength is more than the specific value, thereby improving measuring accuracy of the desirable wave receiving level by correcting phase rotation caused by a frequency error between oscillators included in a transmitter and a receiver when the measurement is made by separating the desirable wave level from the interference wave level and if the reception field strength is the specific value or below (the in-band noise or below) the desirable wave power level is considered to be a desirable wave receiving level or if the reception field strength is more than the specific value (more than the in-band noise) the desirable wave power level is corrected by adding the field strength level to it to consider the corrected level to be a desirable wave receiving level.

In the above receiving level measuring circuit according to the present invention, it further comprises interference wave component averaging means for averaging a plurality of interference wave components detected by the desirable/interference wave detection means and for outputting an interference wave receiving level and signal-to-interference ratio (SIR) measuring means for getting a signal-to-interference ratio (SIR) based on the interference wave receiving level from the interference wave component averaging means and on the desirable wave power level, wherein, in a case that the detected field strength exceeds the specific value in the correction with reference to the specific value in the desirable wave level correction means, the desirable wave level correction means makes a correction of adding the detected field strength level to the desirable wave power level if the SIR is more than zero, but does not make the correction of adding the detected field strength level to the desirable wave power level if the SIR is zero or less, thereby improving measuring accuracy of the desirable wave components by preventing inappropriate correction when no desirable wave exists.

In accordance with another aspect of the present invention, there is provided a receiving level measuring circuit for measuring a receiving level of a received signal received at a plurality of antennas, comprising for each antenna: received signal strength indicator (RSSI) detection means for detecting a field strength of a received signal, desirable/interference wave component power output means for converting the received signal to a baseband signal, detecting a desirable wave and an interference wave for separation, and outputting a desirable wave power level and an interference wave power level, signal-to-interference ratio (SIR) measuring means for getting a signal-to-interference ratio (SIR) from the desirable wave power level and the interference wave power level, desirable wave level correction means for outputting the desirable wave power level as a desirable wave receiving level if the detected field strength is lower than or equal to a predetermined specific value or for making a correction of adding the detected field strength level to the desirable wave power level and a correction using a spreading ratio and a fixed correction value and outputting the corrected level as a desirable wave receiving level, and interference wave level correction means for correcting the interference wave power level using a spreading ratio and a fixed correction value and outputting the corrected value as an interference wave receiving level, and having desirable wave antenna synthesizing means for synthesizing desirable wave receiving levels output from the desirable wave level correction means for each antenna and outputting the synthesized desirable wave receiving level, interference wave antenna synthesizing means for synthesizing the interference wave receiving levels output from the interference wave level correction means for each antenna with weighting by using the SIRs in the corresponding antennas and outputting the synthesized interference wave receiving level, and synthesized SIR measuring means for getting a synthesized SIR from the synthesized desirable wave receiving level and the synthesized interference wave receiving level, thereby enabling a measurement of a receiving level up to a level lower than or equal to an in-band noise in a receiver radio unit so as to adapt to a receiver configuration having a plurality of antennas (branches).

In the above receiving level measuring circuit according to the present invention, the desirable/interference wave component power output means comprises quadrature detection means for performing a quadrature detection of the received signal and converting it to a baseband signal, desirable/interference wave detection means for detecting a plurality of desirable wave components and a plurality of interference wave components from the baseband received signal submitted to the quadrature detection, desirable wave component electricity conversion means for adding the detected plurality of desirable wave components, converting them into electricity, and outputting a desirable wave power level, and interference wave component averaging means for averaging the detected plurality of interference wave components and outputting an interference wave power level, thereby enabling a measurement of a receiving level up to a level lower than or equal to the in-band noise in the receiver radio unit so as to adapt to the receiver configuration having a plurality of antennas (branches) and getting very accurate values on both of the desirable wave and the interference wave.

Furthermore, in the above receiving level measuring circuit according to the present invention, the desirable/interference wave component power output means comprises quadrature detection means for performing a quadrature detection of the received signal and converting it to a baseband signal, desirable/interference wave detection means for detecting a plurality of desirable wave components, a plurality of interference wave components, and a plurality of frequency error vectors from the baseband received signal submitted to the quadrature detection, frequency error correction-value acquisition means for previously storing a correction value corresponding to the frequency error and then adding and averaging the plurality of frequency error vectors detected by the desirable/interference wave detection means so as to get the correction value corresponding to the frequency error submitted to a unit conversion, frequency error correction means for adding the detected plurality of desirable wave components and correcting the desirable wave components using a correction value, desirable wave component electricity conversion means for converting the corrected desirable wave components into electricity to obtain a desirable wave power level, and interference wave component averaging means for averaging the detected plurality of interference wave components and outputting an interference wave power level, thereby enabling a measurement of a receiving level up to a level lower than or equal to the in-band noise in the receiver radio unit so as to adapt to the receiver configuration having a plurality of antennas (branches), getting very accurate values on both of the desirable wave and the interference wave, and further improving measuring accuracy of the desirable wave receiving level by correcting phase rotation caused by a frequency error between oscillators included in a transmitter and a receiver.

BRIEF DESCRIPTION OF THE DRAWINGS

FIG. 3 is a format diagram showing an example of a frame format.

DESCRIPTION OF REFERENCE NUMERALS

Figure 1:
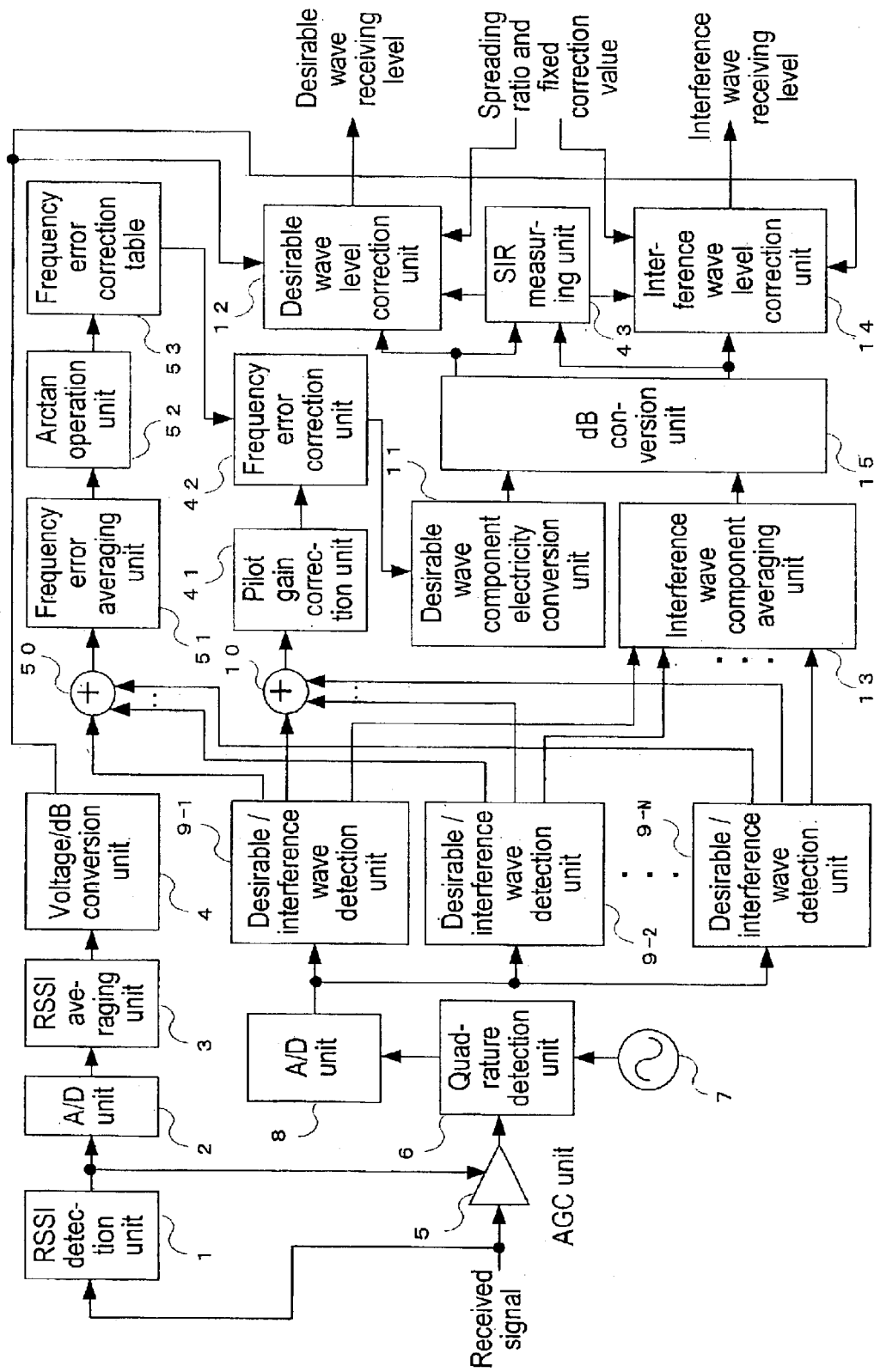
FIG. 1 is a schematic block diagram of a receiving level measuring circuit according to a first embodiment of the present invention.

1 RSSI detection unit
2 Analog-to-digital conversion unit
3 RSSI averaging unit
4 Voltage/dB conversion unit
5 AGC unit
6 Quadrature detection unit
7 Oscillator
8 A/D unit
9, 9' Desirable/interference detection unit
10 Adder
11 Desirable wave component electricity conversion unit
12 Desirable wave level correction unit
13 Interference component averaging unit
14 Interference wave level correction unit
15 dB conversion unit
21 Antenna SIR measuring unit
22 dB conversion unit
23 Desirable wave level correction unit
24 dB conversion unit
25 Interference wave level correction unit
26 Desirable wave antenna synthesizing unit
27 Interference wave antenna synthesizing unit
28 Antenna-synthesized SIR measuring unit
41 Pilot gain correction unit
42 Frequency error correction unit
43 SIR measuring unit
50 Adder
51 Frequency error averaging unit
52 Arctangent operation unit
53 Frequency error correction table
121 Code generation unit
122 Despreading unit
123 Digital AGC unit
125 Reference pilot symbol generation unit
126 Complex multiplier
127 Desirable wave component averaging unit
128 Adder
130 Vector/scalar conversion unit
131 Interference wave component electricity conversion unit
132 Index weighting averaging unit
134 Delay device
135 Complex multiplier

DETAILED DESCRIPTION OF THE PREFERRED EMBODIMENTS

The preferred embodiments of the present invention will now be described hereinafter with reference to the accompanying drawings.

Function implementation means described hereinafter can be any circuits or devices only if they can implement the functions concerned and it is also possible to implement a part or all of the functions with software. Furthermore, the function implementation means can be implemented in a plurality of circuits or a plurality of function implementation means can be implemented in a single circuit.

A receiving level measuring circuit according to a first embodiment of the present invention comprises desirable/interference wave detection means for detecting a plurality of desirable wave components, a plurality of interference wave components, and a plurality of frequency error vectors from the received signal submitted to the quadrature detection, frequency error correction-value acquisition means for previously storing a correction value corresponding to the frequency error and then adding and averaging the plurality of frequency error vectors detected by the desirable/interference wave detection means so as to get the correction value corresponding to the frequency error submitted to a unit conversion, and frequency error correction means for adding the plurality of desirable wave components detected by the desirable/interference wave detection means and for correcting the desirable wave components using the correction value, thereby correcting phase rotation caused by a frequency error between oscillators included in a transmitter and a receiver and improving measuring accuracy of a desirable wave receiving level.

The receiving level measuring circuit according to the first embodiment of the present invention further comprises signal-to-interference ratio (SIR) measuring means for getting an SIR based on the interference wave receiving level and a desirable wave power level, wherein, in a case that the detected field strength exceeds the specific value in the correction with reference to the specific value in the desirable wave level correction means, the desirable wave level correction means makes a correction of adding the detected field strength level to the desirable wave power level if the SIR is more than zero, but does not make the correction of adding the detected field strength level to the desirable wave power level if the SIR is zero or less, thereby improving measuring accuracy of the desirable wave components by preventing inappropriate correction when no desirable wave exists.

The following describes the correspondence between respective means in the first embodiment of the present invention and corresponding units shown in FIG. 1. The received signal strength indicator (RSSI) detection means corresponds to an RSSI detection unit 1, an A/D unit 2, an RSSI averaging unit 3, and a voltage/dB conversion 4; the quadrature detection means corresponds to an AGC unit 5, a quadrature detection unit 6, an oscillator 7, and an A/D unit 8; the desirable/interference detection means corresponds to desirable/interference detection units 9-1 to 9-N; the frequency error correction-value acquisition means corresponds to an adder 50, a frequency error averaging unit 51, an arctangent operation unit 52, and a frequency error correction table 53; the frequency error correction means corresponds to an adder 10, a pilot gain correction unit 41, and a frequency error correction unit 42; the desirable wave component electricity conversion means corresponds to a desirable wave component electricity conversion unit 11 and a dB conversion unit 15; the interference wave component averaging means corresponds to an interference wave component averaging unit 13 and a dB conversion unit 15; the desirable wave level correction means corresponds to a desirable wave level correction unit 12, the interference wave level correction means corresponds to an interference wave level correction unit 14, and the SIR measuring means corresponds to an SIR measuring unit 43.

Figure 9:
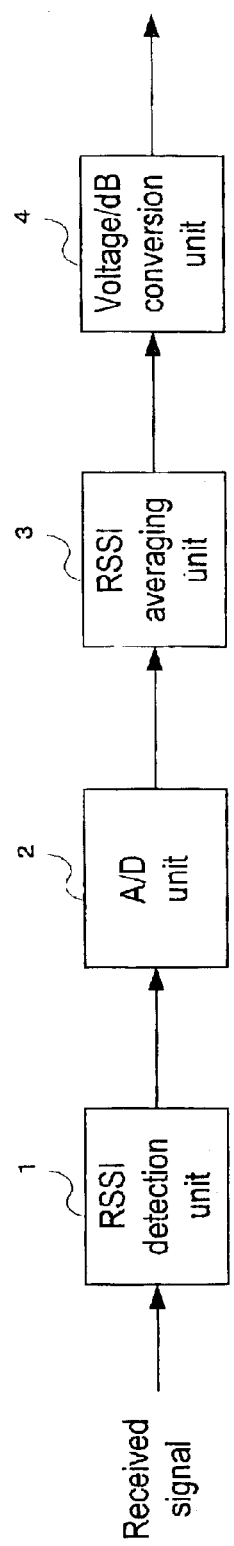
FIG. 9 is a block diagram showing an example of a configuration of a conventional receiving level measuring circuit.

First, a configuration of the receiving level measuring circuit according to the first embodiment of the present invention (a first receiving level measuring circuit) will be described below with reference to FIG. 1. Referring to FIG. 1, there is shown a schematic block diagram of the receiving level measuring circuit according to the first embodiment of the present invention. The parts each having the same configuration as in FIG. 9 are designated by identical reference numerals in the description.

The first receiving level measuring circuit of the present invention comprises the same portions as for the conventional receiving level measuring circuits, more specifically, the RSSI detection unit 1, the analog-to-digital conversion unit 2, the RSSI averaging unit 3, and the voltage/dB conversion unit 4 and further comprises characterizing portions of the present invention, more specifically, the AGC unit 5, the quadrature detection unit 6, the oscillator 7, the A/D unit 8, the plurality of desirable/interference wave detection units 9, the adder 10, the pilot gain correction unit 41, the frequency error correction unit 42, the desirable wave component electricity conversion unit 11, the dB conversion unit 15, the desirable wave level correction unit 12, the interference component averaging unit 13, the interference wave level correction unit 14, the SIR measuring unit 43, the adder 50, the frequency error averaging unit 51, the arctangent operation unit 52, and the frequency error correction table 53.

Next, the components of this apparatus will be described more specifically. Note that, however, a description of the RSSI detection unit 1, the analog-to-digital conversion unit 2, the RSSI averaging unit 3, and the voltage/dB conversion unit 4 included for detecting a radio unit RSSI like the conventional apparatus will be omitted here since their operations are exactly the same as those of the conventional one. The following describes only the characterizing portions of the present invention specifically.

The AGC unit 5 performs an automatic gain control (AGC) and amplifies (or attenuates) received power so as to be constant using an RSSI voltage detected by the RSSI detection unit 1.

The quadrature detection unit 6 demodulates a received signal in the radio frequency band and downconverts it to in phase and quadrature components in the baseband.

The oscillator 7 outputs a carrier wave to the quadrature detection unit 6.

The A/D unit 8 converts the analog baseband received signal downconverted in the quadrature detection unit 6 to a digital value.

The desirable/interference wave detection units 9 detect desirable wave components, interference wave components, and frequency error vectors from the baseband received signal converted to a digital signal and a plurality of the desirable/interference wave detection units 9 are mounted for each spread code. In the DC-CDMA system, they are used to detect a desirable wave component, an interference wave component, and a frequency error vector for each path with separating a multipath. The details of the internal configuration will be described later.

The adder 50 adds up and synthesizes the frequency error vectors sent from the plurality of the desirable/interference wave detection units 9.

The frequency error averaging unit 51 averages the added frequency error vectors. The operation is performed since the frequency error vectors from the desirable/interference wave detection units 9 are amounts of phase rotation in one symbol duration and include amounts of phase rotation caused by fading or the like and therefore the frequency error averaging unit 51 averages the frequency error vectors for a long period of time to eliminate the, components of phase rotation-caused by fading so that they are detected as fixed amounts of phase rotation caused by frequency errors.

The arctangent operation unit (shown as arctan operation unit) 52 makes an arctan operation for the averaged frequency error vector to perform a unit conversion for the frequency error (Hz). More specifically, the arctan operation is made for the averaged frequency error vector to calculate $\Delta\theta$ and further to calculate the frequency error (Hz) from one symbol time length before the unit conversion.

The frequency error correction table 53, which includes a correction table where correction values corresponding to frequency errors are stored in a table format, receives an input of a frequency error (Hz) output from the arctangent operation unit 52 and outputs its corresponding correction value. The details of the correction table will be described later.

The adder 10 adds and synthesizes the desirable wave components output from the plurality of desirable/interference wave detection units 9.

The pilot gain correction unit 41 corrects an offset of a pilot symbol portion added at the transmitting end. In other words, considering a case where the pilot symbol portion is sent with a power offset added to the power of the data symbol portion (a pilot gain) at the transmitting end, the pilot gain correction unit 41 corrects the offset of the pilot gain. For example, if the pilot symbol is sent with a half power for the data symbol, the pilot gain correction unit 41 corrects the pilot gain by multiplying the synthesized desirable wave component by $\sqrt{2}$.

The frequency error correction unit 42 corrects a frequency error using a frequency error correction value output from the frequency error correction table 53 for the desirable wave component, whose pilot gain was corrected after the addition.

The desirable wave component electricity conversion unit 11 converts the desirable wave component after the frequency error correction.

The interference component averaging unit 13 averages the interference wave components received from the plurality of desirable/interference wave detection units 9.

The dB conversion unit 15 makes a dB conversion for desirable wave component power that is an output from the desirable wave component electricity conversion unit 11 and for interference wave component power that is an output from the interference component averaging unit 13.

The SIR measuring unit 43 obtains a signal-to-interference ratio (SIR) from the desirable wave component power and the interference wave component power dB-converted by the dB conversion unit 15.

The desirable wave level correction unit 12 receives inputs of the averaged RSSI dB-converted by the voltage/dB conversion unit 4, the spreading ratio of the signal spread in the spread modulation at the transmitting end, the fixed correction value for correcting the desirable wave component power measured in the receiver to an absolute power value, and the SIR value measured by the SIR measuring unit 43, corrects the desirable wave component power output from the dB conversion unit 15, and outputs a desirable wave receiving level. The details of the correction will be described later.

The interference wave level correction unit 14 receives inputs of the averaged RSSI dB-converted by the voltage/dB conversion unit 4, the spreading ratio of the signal spread in the spread modulation at the transmitting end, the fixed correction value for correcting the desirable wave component power measured in the receiver to an absolute power value, and the SIR value measured by the SIR measuring unit 43, corrects the interference wave component power output from the dB conversion unit 15, and outputs an interference wave receiving level. The details of the correction will be described later.

Figure 2:
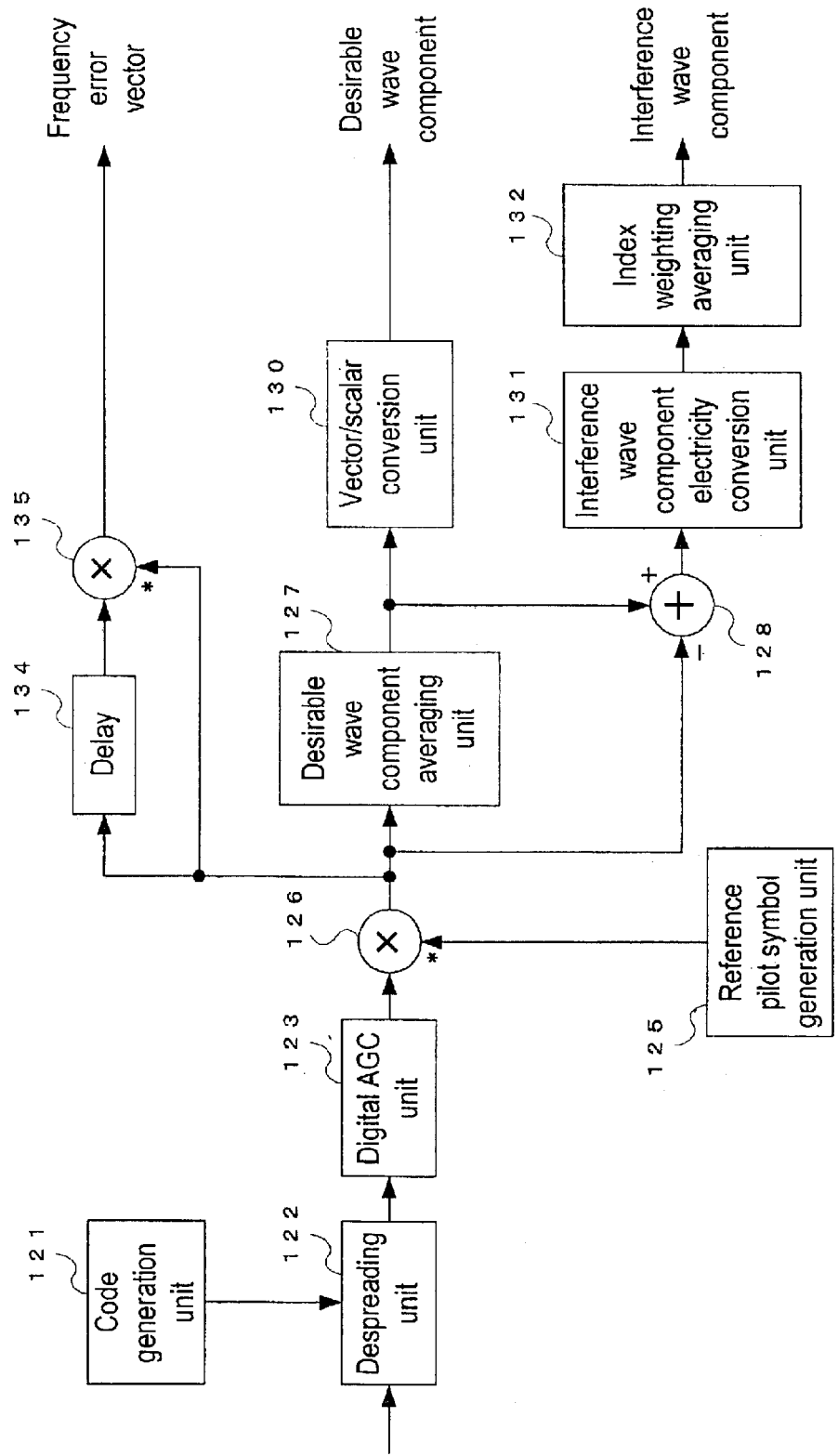
FIG. 2 is a block diagram showing an internal configuration of a desirable/interference wave detection unit of the receiving level measuring circuit according to the first embodiment of the present invention.

Next, an internal configuration of the desirable/interference wave detection units 9 of the first receiving level measuring circuit according to the present invention will be described with reference to FIG. 2. Referring to FIG. 2, there is shown a block diagram illustrating the internal configuration of the desirable/interference wave detection units 9 according to the present invention.

As shown in FIG. 2, the internal components of the desirable/interference wave detection units 9 according to the present invention are a code generation unit 121, a despreading unit 122, a digital AGC unit 123, a reference pilot symbol generation unit 125, a complex multiplier 126, a desirable wave component averaging unit 127, an adder 128, a vector/scalar conversion unit 130, an interference wave component electricity conversion unit 131, an index weighting averaging unit 132, a delay device (shown as Delay) 134, and a complex multiplier 135.

The internal components of the desirable/interference wave detection units 9 will be described below.

The code generation unit 121 generates a spread code for reference. It generates spread codes different from each other among respective desirable/interference wave detection units 9-1 to 9-N.

The despreading unit 122 performs despreading through a correlation operation between the baseband received signal output from the A/D unit 8 and the reference spread code output from the code generation unit 121.

The digital AGC unit 123 upshifts the signal after the despreading according to the spreading ratio at the transmitting end. Assuming that A is an amplitude of the signal before despreading, for example, an ideal relationship between an amplitude after despreading and the spreading ratio at the transmitting end is as shown in Table 1.

TABLE 1

| Spreading ratio | Amplitude after despreading |
| --- | --- |
| 256 | 256 × A |
| 128 | 128 × A |
| 64 | 64 × A |
| 32 | 32 × A |

As shown in Table 1, an amplitude after despreading depends upon a spreading ratio; as the spreading ratio goes down, the amplitude after despreading gets lower, in other words, the signal bits decreases. Accordingly, assuming that a process on the subsequent stage is performed in a fixed-point arithmetic operation, the decrease of the bits causes a characteristic deterioration. Therefore, the digital AGC unit 123 makes an upshift in accordance with a spreading ratio so that the number of bits after despreading is constant to prevent the deterioration caused by the decrease of the number of operation bits.

The reference pilot symbol generation unit 125 generates a reference pilot symbol for obtaining an amplitude phase variation, which is described later.

The complex multiplier 126 performs a complex conjugate multiplication of the received signal after the digital AGC and the reference pilot symbol to obtain an amplitude phase variation and considers it to be a desirable wave component vector.

The desirable wave component averaging unit 127 averages the desirable wave component vectors sent from the complex multiplier 126.

The vector/scalar conversion unit 130 converts the desirable wave component vector to a scalar.

The adder 128 calculates a difference between the averaged desirable wave component vector output from the desirable wave component averaging unit 127 and the desirable wave component vector not averaged and considers it to be an interference wave component vector.

The interference wave component electricity conversion unit 131 calculates power of the interference wave component vector and averages a given number of pilot symbols.

The index weighting averaging unit 132 averages the interference wave components converted to electricity with index weighting for a long interval.

The delay (shown as Delay) 134 delays a signal to be input by one symbol duration.

The complex multiplier 135 performs a complex multiplication of an amplitude phase variation in a certain symbol and an amplitude phase variation in its previous symbol to calculates the amount of phase rotation in one symbol duration as a frequency error vector.

Next, an operation of the first receiving level measuring circuit according to the present invention will be described below with reference to FIGS. 1 and 2.

In the first receiving level measuring circuit according to the present invention, the received signal on the radio frequency band input to the receiver is input to the RSSI detection unit 1 in the same manner as for the conventional one, the RSSI is detected and output as an analog voltage value and then it is converted to a digital value in the analog-to-digital conversion unit 2, submitted to a given averaging process in the RSSI averaging unit 3, and converted to a dB value in the voltage/dB conversion unit 4, and a result of measuring the receiving level of the radio signal input to the receiver is output as a db value of the RSSI.

On the other hand, the input received signal in the radio frequency band is controlled so that the received power remains constant by performing a gain control in the AGC unit 5 using the RSSI voltage detected in the RSSI detection unit 1. Furthermore, it is downconverted in the quadrature detection unit 6 to inphase and quadrature components in the baseband with a carrier wave from the oscillator 7. The downconverted baseband received signal is converted to a digital signal in the A/D unit 8 and input in parallel to the plurality of desirable/interference wave detection units 9.

Hereinafter, an internal operation of each desirable/interference wave detection unit 9 will be described.

Within each desirable/interference wave detection unit 9, the input baseband digital received signal is input to the despreading unit 122, where the received signal is despread through a correlation operation with a reference spread code output from each code generation unit 121, and the received symbol after despreading is input to the digital AGC unit 123.

Then, the digital AGC unit 123 upshifts the signal after despreading according to the spreading ratio in the spread modulation at the transmitting end so as to have a fixed amplitude. The pilot symbol portion of the received symbol after the digital AGC is submitted to the complex conjugate multiplication in the complex multiplier 126 with the reference pilot symbol output from the reference pilot symbol generation unit 125 and the measurement result is output as an amplitude phase variation, namely, a desirable wave component vector. The desirable wave component averaging unit 127 averages a given number of pilot symbols and then the vector/scalar conversion unit 130 calculates and outputs its magnitude (scalar).

Furthermore, the adder 128 calculates a difference between the desirable wave component vector not averaged output from the complex multiplier 126 and the averaged desirable wave component vector output from the desirable wave component averaging unit 127, with the difference considered to be an interference wave component vector. The interference wave component electricity conversion unit 131 makes a conversion to electricity and averages a given number of pilot symbols. Furthermore, the index weighting averaging unit 132 averages the interference wave components for a long interval and outputs a result.

Figure 3:
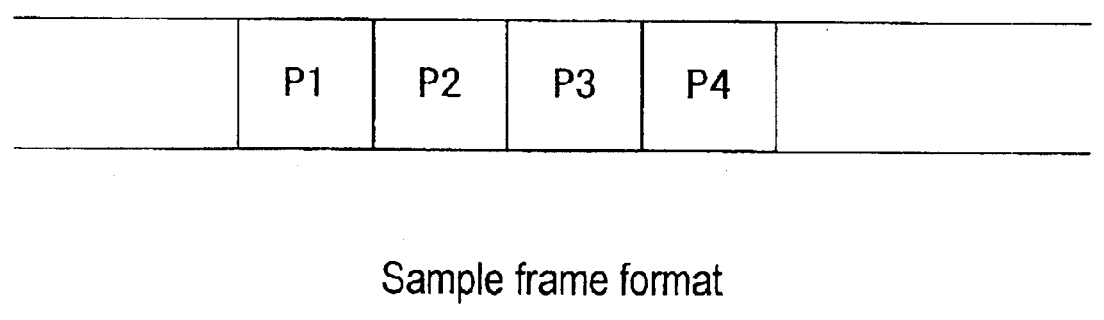
Figure 4:
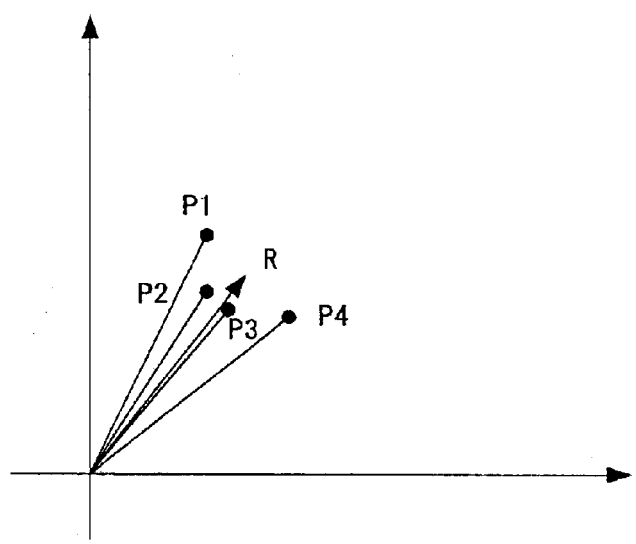
FIG. 4 is an explanatory diagram showing conditions of averaging desirable wave component vectors.

Hereinafter, the desirable wave components and the interference wave components will be described with reference to FIGS. 3 and 4 and equations. Referring to FIG. 3, there is shown a format diagram showing an example of a frame format. Referring to FIG. 4, there is shown an explanatory diagram showing conditions of averaging desirable wave component vectors.

It is assumed that the received signal has pilot symbols P1 to P4 periodically inserted therein as shown in FIG. 3. Assuming that desirable wave component vectors at the pilot symbols P1 to P4 are vectors P1 to P4 shown in FIG. 4, the desirable wave component vectors after the averaging become a vector R shown in FIG. 4.

The desirable wave component vector averaged in the desirable wave component averaging unit 127 is expressed by the following equation 1.

$$R = \frac{1}{N}\sum_{i=1}^{n} Pi \qquad [\text{Eq. 1}]$$

where N is the number of pilot symbols.

Still further, if the desirable wave component vector is submitted to the vector/scalar conversion in the vector/scalar conversion unit 130, its output S is expressed by the following equation 2.

$$\text{If } R = Rx + jRy \text{ then } S = |R| = \left|\frac{1}{N}\sum_{i=1}^{n} Pi\right| = \sqrt{Rx^2 + Ry^2} \qquad [\text{Eq. 2}]$$

where N is the number of pilot symbols.

On the other hand, the variance of the desirable wave component vectors P1 to P4 before averaging relative to the desirable wave component vector R after averaging, in other words, an interference wave component I represented by an interference wave component vector is an output from the interference wave component electricity conversion unit 131 and it is expressed by the following equation 3.

$$I = \frac{1}{N}\sum_{i=1}^{n} |(R - Pi)|^2 \qquad [\text{Eq. 3}]$$

where N is the number of pilot symbols.

Furthermore, the interference wave-components are averaged for a long interval in the index weighting averaging unit 132 and the desirable wave component (S) and the interference wave component (I) can be obtained in each of the plurality of desirable/interference wave detection units 9.

On the other hand, the signal received in the receiver includes phase rotation caused by a frequency error between an oscillator at the transmitting end and an oscillator at the receiving end. To correct the error, the complex multiplier 135 performs a complex multiplication of an amplitude phase variation (a desirable wave component vector) at a certain symbol to be output from the complex multiplier 126 and an amplitude phase variation (a desirable wave component vector) at the previous symbol delayed by one symbol duration in the delay device 134 to calculate a difference therebetween and to obtain an amount of phase rotation in one symbol duration as a frequency error vector.

An example of the operation in each desirable wave interference wave detection unit 9 has been set forth hereinabove.

Since a multipath can be separated into individual paths by despreading in the DS-CDMA method, it is possible to obtain a desirable wave component (S) and an interference wave component (I) for each path by allocating the separated delayed waves to respective desirable/interference wave detection units 9 and to obtain the target desirable wave level and interference wave level by synthesizing and averaging the above components.

The following describes an operation of obtaining the desirable wave receiving level and the interference wave receiving level after synthesization and averaging based on the desirable wave components (S) and the interference wave components (I) sent from the plurality of desirable/interference wave detection units 9.

Regarding the desirable wave component (S), the adder 10 adds up the desirable wave components detected in the desirable/interference wave detection units 9 ([Eq. 2]), thereby getting a sum of the desirable wave components of the separated paths so as to obtain a synthesized desirable wave component.

As one of the characteristics of the first embodiment according to the present invention, the pilot gain correction unit 41 corrects the synthesized desirable wave component for a pilot gain added by the transmitting part, taking into consideration a case where a power offset (pilot gain) is added to the pilot symbol portion relative to the power of the-data symbol portion at the transmitting end.

As the second characteristic of the first embodiment according to the present invention, a frequency error is corrected for the synthesized desirable wave component after the pilot gain correction.

More specifically, the adder 50 adds up the frequency error vectors output from the desirable/interference wave detection units 9, thereby calculating a frequency error vector after the synthesization, and further the frequency error averaging unit 51 averages the frequency error vectors for a long interval, thereby eliminating the components of phase rotation caused by fading, and they are detected as fixed amounts of phase rotation caused by frequency errors.

Subsequently, the arctangent operation unit 52 performs an arctan operation for the averaged frequency error vector to calculate a frequency error (Hz), thereby getting a correction value corresponding to the frequency error on the frequency error correction table 53.

The correction table included in the frequency error correction table 53 will be described in detail below.

First, an ideal condition free from any frequency error will be considered.

Assuming that R is the desirable wave component vector after averaging in the desirable wave component averaging unit 127,

R (1, 0)

Correspondingly, assuming that f is a frequency error and N is the number of symbols to be averaged, a desirable wave component vector $R'_1$ of the ith symbol is expressed by the following equation:

$$R'_i = (I+jQ) \times (\cos(2\pi ft) + j\sin(2\pi ft)) \quad \text{(Eq. 4)}$$

Therefore, assuming that there is no variation in the amplitude direction when the frequency error is 200 Hz, the number of averaged symbols is 4, and the symbol rate is 15 ksps, for example, and that f=200, t=N×(1/15000), I=1, and Q=0 in the above equation, the desirable wave component vectors $R'_1$, $R'_2$, $R'_3$, and $R'_4$ are as follows:

$R'_1$ (1, 0)
$R'_2$ (0.996493, 0.083678)
$R'_3$ (0.985996, 0.166769)
$R'_4$ (0.968583, 0.24869)

Therefore, the averaged desirable wave component vector R' for the above four symbols is given by [Eq. 2] as follows:

R' (0.987768, 0.124784)
and its size is
|R'|=0.995619
which is 0.995619 times the desirable wave component vector having no frequency error.

Accordingly, a value correcting the above value to 1, in other words, the following can be associated with the frequency error 200 Hz as its correction value on the correction table:

Table correction value in 200 Hz 1/0.995619=1.004401

In this manner, correction values are previously calculated for a plurality of frequency errors and they are stored in the correction table.

Then the frequency error correction table 53 outputs correction values corresponding to frequency errors from the arctangent operation unit 52 to the frequency error correction unit 42.

Subsequently, the correction value calculated correspondingly to the frequency error on the frequency error correction table 53 is output to the frequency error correction unit 42, in which the correction value is multiplied by the synthesized desirable wave component vector from the pilot gain correction unit 41 for correction, and further the desirable wave component electricity conversion unit 11 converts the corrected desirable wave component into electricity.

On the other hand, regarding the interference wave component (I), the interference wave components ([Eq. 3]) of respective paths are further averaged by the interference component averaging unit 13. This operation utilizes that the desirable wave components are synthesized through so-called rake synthesization that synthesizes the paths separated by despreading while the interference wave components are averaged to be suppressed after synthesization since they are independent of each other on each path.

Thereafter, the desirable wave component power output from the desirable wave component electricity conversion unit 11 and the interference wave component power output from the interference component averaging unit 13 are converted by the dB conversion unit 15, respectively. For the desirable wave component power and the interference wave component power having undergone the dB conversion, their signal-to-interference ratio (SIR) is measured by the SIR measuring unit 43.

Figure 5:
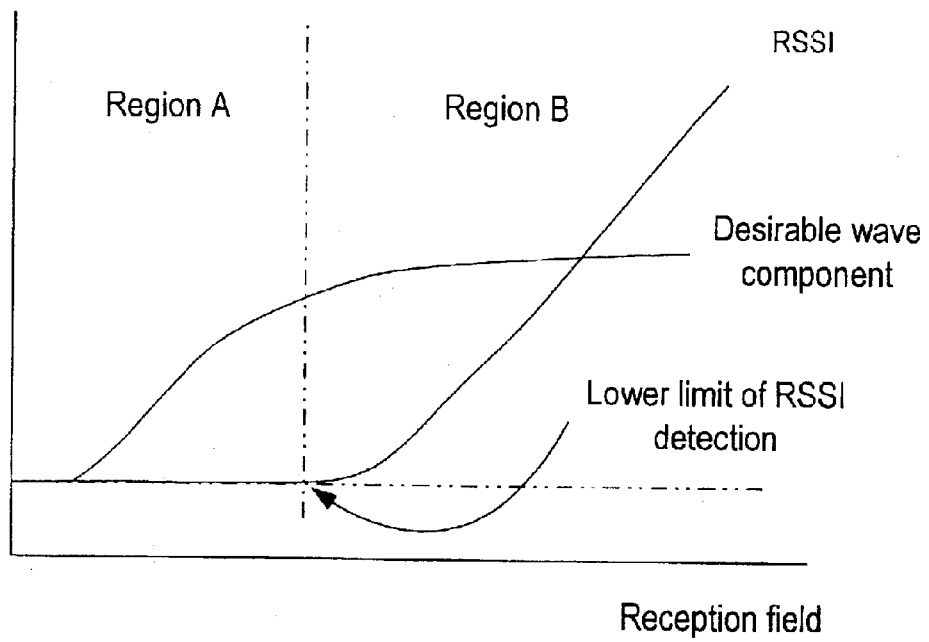
FIG. 5 is an explanatory diagram typically showing a relationship between a desirable wave component detected in the baseband and an RSSI.

Next, a concept of a method of correcting the desirable wave component and the interference wave component will be described below with reference to FIG. 5. Referring to FIG. 5, there is shown an explanatory diagram typically showing a relationship between the desirable wave components detected in the baseband and RSSI.

As shown in FIG. 5, if the reception field comes to the vicinity of the in-band noise level (shown as region A), the radio unit RSSI detected by the RSSI detection unit 1 to the voltage/dB conversion unit 4 draws a floor line and it is not detected incorrectly, by which the radio unit AGC cannot be performed appropriately. On the other hand, the desirable wave components in the baseband can be detected linearly in the region A.

To the contrary, since the radio unit RSSI can be correctly detected in the region B in FIG. 5, the radio unit AGC is correctly performed and therefore the desirable wave components in the baseband run into saturation, thereby disabling a correct RSSI detection.

Therefore, the desirable wave components detected in the baseband are used directly in the region A and the radio unit RSSI is added as a correction value to the desirable wave components detected in the baseband by using the desirable wave components detected in the baseband and the radio unit RSSI detected by the RSSI detection unit 1 to the voltage/dB conversion unit 4, thereby enabling an appropriate receiving level detection in the whole reception field region.

A concrete method of implementing the above correction method will be described below.

First, the lower limit of the radio unit RSSI detected by the RSSI detection unit 1 to the voltage/dB conversion unit 4 is previously retained as an analog parameter in the desirable wave level correction unit 12. In FIG. 5, the RSSI lower limit is assumed to be a value at a point where the RSSI curve intersects with the boundary line between the region A and the region B. Furthermore, if the detected radio unit RSSI reaches the lower limit and further falls into a lower value, the correction with the radio unit RSSI is inhibited. In other words, the corrected desirable wave level is:

Desirable wave level before correction+(Detected radio unit RSSI−Lower limit of detected radio unit RSSI)  (Eq. 5)

The equation 5 enables an omission of the correction with RSSI due to a low reliability of the RSSI value in the region where AGC is performed incorrectly in the radio unit (the region A in FIG. 5) and enables a correction with RSSI in the region where AGC is performed correctly (the region B in FIG. 5).

Furthermore, the desirable wave level correction unit 12 corrects the desirable wave level detected in the baseband to an absolute power. In this correction, a spreading gain, which is gotten by spread modulation at the transmitting end, and a fixed correction value to the digital AGC unit 123 of the desirable/interference wave detection unit 9 are previously retained as parameters, and they are added to the desirable wave levels after the correction with the radio unit RSSI, by which the absolute power value of the target desirable wave level is obtained.

The following describes an example of a fixed correction value to the digital AGC unit 123 of the desirable/ interference wave detection unit 9.

The following considers a case where no interference exists in a received wave received by the receiver, in other words, where the received power contains only a desirable wave. In this condition, a spreading gain is obtained by despreading in the baseband. In other words, Ideal desirable wave level=Radio unit RSSI without interference  (Eq. 6)

A fixed offset is added to the desirable wave level detected in the baseband in an operation format or in a realizing method relative to the ideal desirable wave level. To absorb the offset, a difference between the ideal desirable wave level of an input received signal having no interference and a measured desirable wave level is previously retained as a fixed correction parameter and the correction value is added to the measured desirable wave level, thereby enabling a correction to an absolute power value.

Furthermore, the SIR relation between the desirable wave level and the interference wave level can be expressed by the following equation:

SIR (dB)=Desirable wave level−Interference wave level+Spreading gain  (Eq. 7)

Therefore, the interference wave level correction unit 14 corrects the interference wave component power to an absolute power value enabling the relation in the equation 7 relative to the correction performed by the desirable wave level correction unit 12.

In the DS-CDMA system, a plurality of transmitters and receivers communicate on an identical radio frequency band, and therefore all of signals input to a receiver are not desirable wave components, but including interference wave components, as described in the description of the conventional technology.

Therefore, if the radio unit RSSI is added to the desirable wave level for correction according to the equation 5 and it is considered to be a result of measuring the receiving level when the reception field has a level more than or equal to the in-band noise in the correction in the desirable wave level correction unit 12, the correction is made even if no desirable wave exists in the received signal and it is likely to cause the value to be measured as a level as if a desirable wave existed despite no desirable wave exists.

Therefore, the first embodiment according to the present invention has the third characteristic of preventing an inappropriate correction under such a condition that no desirable wave exists by using an SIR value for a threshold of the correction in such a manner that no correction is made according to the equation 5 if SIR is less than or equal to 0 dB while the correction is made if SIR is more than 0 dB, for example, using SIR measured by the SIR measuring unit 43.

The receiving level measuring circuit described above can be a digital signal processor (DSP).

According to the receiving level measuring circuit of the first embodiment of the present invention, the plurality of desirable/interference wave detection units 9 separate multipath with-despreading to detect a desirable wave component and an interference wave component for each path from the separated delayed wave, the adder 10 synthesizes the desirable wave components detected by the desirable/ interference wave detection unit 9, and the interference component averaging unit 13 averages the interference wave components, by which the desirable wave level can be measured separately from the interference wave level, thereby generating an effect that it is possible to acquire a desirable wave component level excluding unnecessary interference wave component included in the received wave as a receiving level.

Furthermore, according to the first receiving level measuring circuit of the present invention, the desirable wave level correction unit 12 uses the desirable wave level directly if the reception field strength is equal to or lower than the in-band noise or corrects the desirable wave level by adding the radio unit RSSI to it to consider it to be a result of measuring the receiving level if the reception field strength level is more than the in-band noise for the desirable wave level gotten by synthesizing the desirable wave components detected by the desirable/interference wave detection units 9, thereby generating an effect of achieving a receiving level measuring circuit capable of measuring a receiving level up to a level lower than or equal to the in-band noise of the receiver ratio unit.

Still further, according to the first receiving level measuring circuit of the present invention, if the radio unit RSSI is added to the desirable wave level for the correction to consider the value to be a result of measuring the receiving level for a level more than the in-band noise as described above, the SIR measuring unit 43 measures the signal-to-interference ratio (SIR) and the desirable wave level correction unit 12 determines whether the correction with RSSI added should be performed using the SIR as a threshold so as to prevent an inappropriate correction from being made despite of no desirable wave exists in the received signal, thereby generating effects of preventing an inappropriate correction under such a condition that no desirable wave exists and improving measuring accuracy of the desirable wave component.

Still further, according to the first receiving level measuring circuit of the present invention, in order to correct phase rotation caused by a frequency error between an oscillator at the transmitting end and an oscillator at the receiving end, each desirable/interference wave detection unit 9 obtains the amount of phase rotation between symbols as a frequency error vector and the frequency error correction unit 42 corrects the desirable wave component vector using a correction value corresponding to the previously stored frequency error, thereby generating an effect of improving measuring accuracy of the desirable wave component.

Furthermore, according to the first receiving level measuring circuit of the present invention, since the frequency error vectors detected by the desirable/interference wave detection units 9 include the amounts of phase rotation caused by fading or the like, the adder 50 synthesizes the frequency error vectors from the desirable/interference wave detection units 9 and then the frequency error averaging unit 51 averages the frequency error vectors for a long interval to eliminate the components of the phase rotation caused by fading, so that they are detected as fixed amounts of phase rotation caused by frequency errors, thereby generating effects of improving correcting accuracy of the frequency error and improving measuring accuracy of the desirable wave components.

Furthermore, according to the receiving level measuring circuit of the present invention, in order to correct an offset (a pilot gain) of the pilot symbol portion added at the transmitting end, the pilot gain correction unit 41 corrects the synthesized desirable wave components according to the pilot gain added at the transmitting end, by which the desirable wave receiving level measured using the pilot symbol can be more approximated to the desirable wave receiving level of the data symbol, thereby generating an effect of improving accuracy of the desirable wave receiving level.

Furthermore, by using the first receiving level measuring circuit according to the present invention for a base station and a mobile station of a CDMA wireless communication system, the desirable wave power level is output as a desirable wave receiving level if the detected field strength drops to a level less than or equal to a predetermined specific value (the RSSI lower limit) while the detected field strength level is added to the desirable wave power level for the correction if the detected field strength is more than the specific value, thereby generating effects of measuring a receiving level accurately in the whole reception field and enabling an effective closed-loop control type transmission power control.

More specifically, the arrangement is achieved by providing the first receiving level measuring circuit according to the present invention and installing a transmitter and a receiver using an output from the receiving level measuring circuit for a control of the transmission power at a base station or a mobile station.

In addition to the above basic corrections, it is possible to determine whether a correction should be made when no desirable wave exists, to correct a frequency error between an oscillator at the transmitting end and an oscillator at the receiving end, or to correct a pilot gain, thereby generating effects of improving measuring accuracy of the desirable wave receiving level and the interference wave receiving level and enabling an effective closed-loop control type transmission power control.

The following will describes a receiving level measuring circuit according to a second embodiment adapting to a receiver configuration having a plurality of antennas (branches).

Describing the receiving level measuring circuit on the dominant conception, the receiving level measuring circuit according to the second embodiment of the present invention detects a field strength of the radio frequency band and a desirable wave level and an interference wave level in the baseband with being associated with a signal received at a plurality of antennas; if the detected field strength is lower than or equal to a predetermined in-band noise, the receiving level measuring circuit outputs the desirable wave power level as a desirable wave receiving level, while, if the detected field strength is more than the in-band noise, the detected field strength level is added to the desirable wave power level for a correction and the resultant value is considered to be a desirable wave receiving level of each antenna, and the desirable wave receiving levels and the interference wave receiving levels at each antenna are synthesized to get a synthesized desirable wave receiving level and a synthesized interference wave receiving level, respectively, so that a synthesized signal-to-interference ratio (SIR) is calculated from the synthesized desirable wave receiving level and the synthesized interference wave receiving level, by which in a receiver having a configuration of a plurality of antennas the desirable wave level and the interference wave level can be measured after they are separated from each other and they can be measured up to a level lower than or equal to the in-band noise in the receiver ratio unit.

Describing the receiving level measuring circuit in function implementation means, the receiving level measuring circuit according to the second embodiment of the present invention comprises for each antenna: received signal strength indicator (RSSI) detection means for detecting a field strength of a received signal, desirable/interference wave component power output means for converting the received signal to a baseband signal, detecting a desirable wave and an interference wave for separation, and outputting a desirable wave power level and an interference wave power level, signal-to-interference ratio (SIR) measuring means for getting a signal-to-interference ratio (SIR) from the desirable wave power level and the interference wave power level, desirable wave level correction means for outputting the desirable wave power level as a desirable wave receiving level if the detected field strength is lower than or equal to a predetermined specific value or for making a correction of adding the detected field strength level to the desirable wave power level and a correction using a spreading ratio and a fixed correction value and outputting the corrected level as a desirable wave receiving level, and interference wave level correction means for correcting the interference wave power level using a spreading ratio and a fixed correction value and outputting the corrected value as an interference wave receiving level, and having desirable wave antenna synthesizing means for synthesizing desirable wave receiving levels output from the desirable wave level correction means for each antenna and outputting the synthesized desirable wave receiving level, interference wave antenna synthesizing means for synthesizing the interference wave receiving levels output from the interference wave level correction means for each antenna with weighting by using the SIRs in the corresponding antennas and outputting the synthesized interference wave receiving level, and synthesized SIR measuring means for getting a synthesized SIR from the synthesized desirable wave receiving level and the synthesized interference wave receiving level, wherein the desirable wave receiving levels and the interference wave receiving levels acquired at each antenna are synthesized to get a desirable wave receiving level and an interference wave receiving level of a receiver, respectively, and further a signal-to-interference ratio (SIR) of the receiver is calculated, thereby enabling a measurement of a receiving level up to a level lower than or equal to an in-band noise in a receiver radio unit, adapting to a receiver configuration having a plurality of antennas (branches).

Describing the correspondence between the means of the second embodiment according to the present invention and the components in FIG. 1, the received signal strength indicator (RSSI) detection means corresponds to the RSSI detection unit 1, the A/D unit 2, the RSSI averaging unit 3, and the voltage/dB conversion unit 4; the desirable/interference wave component power output means corresponds to the desirable/interference wave component output unit 20; the signal-to-interference ratio (SIR) means corresponds to the antenna SIR measuring unit 21; the desirable wave level correction means corresponds to the dB conversion unit 22 and the desirable wave level correction unit 23; the interference wave level correction means corresponds to the dB conversion unit 24 and the interference wave level correction unit 25; the desirable wave antenna synthesizing means corresponds to the desirable wave antenna synthesizing unit 26; the interference wave antenna synthesizing means corresponds to the interference wave antenna synthesizing unit 27; and the synthesized SIR measuring means corresponds to the antenna-synthesized SIR measuring unit 28.

Figure 6:
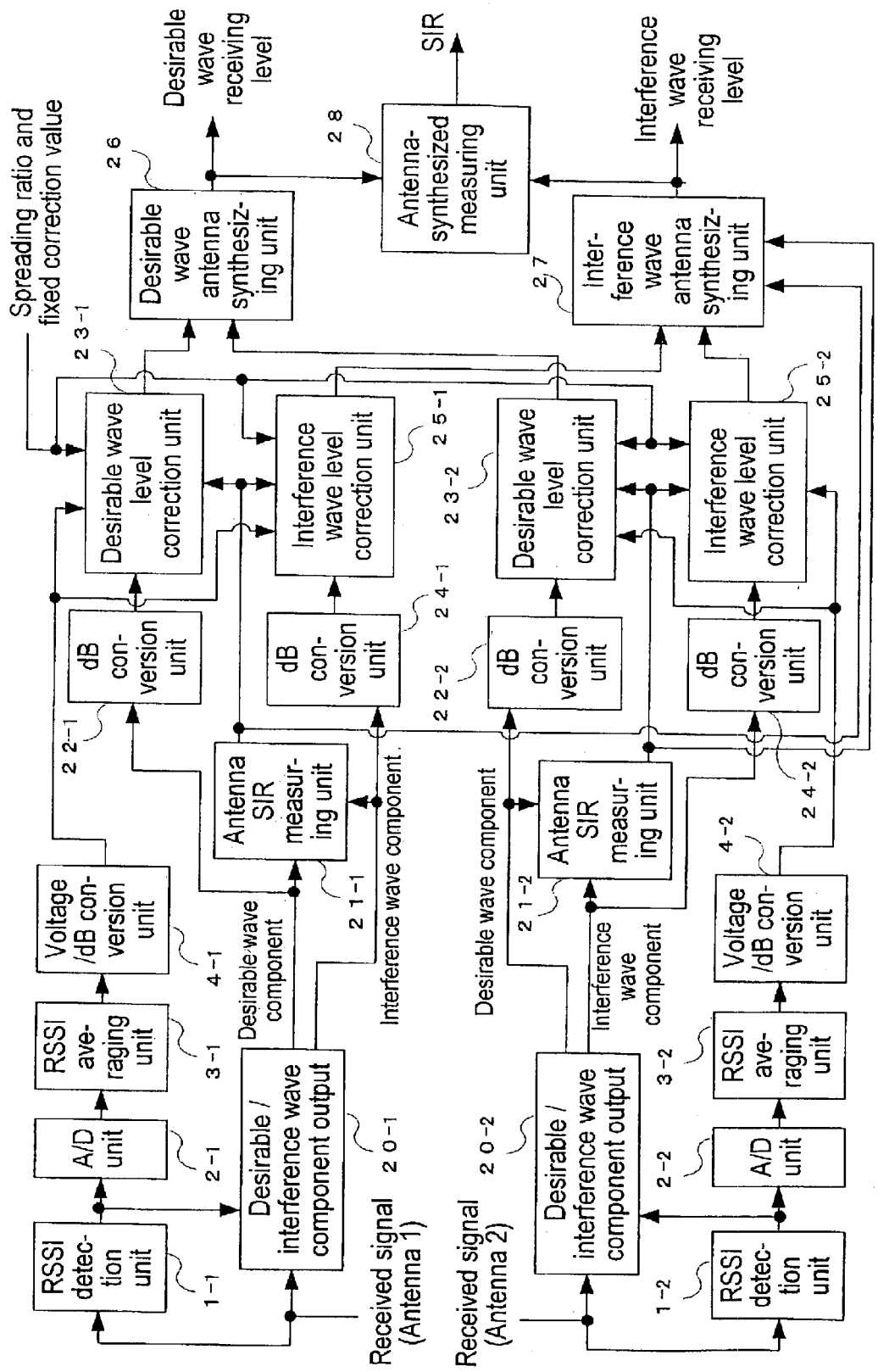
FIG. 6 is a schematic block diagram of a receiving level measuring circuit according to a second embodiment of the present invention.

First, a configuration of the receiving level measuring circuit according to the second embodiment of the present invention (a second receiving level measuring circuit) will be described with referenced to FIG. 6. Referring to FIG. 6, there is shown a schematic block diagram of a receiving level measuring circuit according to the second embodiment of the present invention. In this description, portions having; the same configuration as in FIG. 9 are designated by identical reference numerals. FIG. 6 shows a configuration having two antennas.

The second receiving level measuring circuit of the present invention comprises antenna-series components, which are installed with being associated with antennas, for separating and measuring a desirable wave level and an interference wave level for a received signal and a synthesizing portion for synthesizing the desirable wave levels output from the antenna-series components and the interference wave levels to measure a receiving level of the receiver in total.

The antenna-series components in the second receiving level measuring circuit of the present invention include the same portions as in the conventional receiving level measuring circuit; an RSSI detection unit 1, an analog-to-digital conversion unit (shown as the A/D unit) 2, a RSSI averaging unit 3, and a voltage/dB conversion unit 4 and the characterizing portions of the present invention; a desirable/interference wave component output unit 20, an antenna SIR measuring unit 21, a dB conversion unit 22, a desirable wave level correction unit 23, a dB conversion unit 24, and an interference wave level correction unit 25.

In FIG. 6, -1 is appended to a reference numeral for a component of the antenna (1) series and -2 is appended to a reference numeral for a component of the antenna (2) series.

If there are two or more antennas, the above components such as the RSSI detection unit 1 to the interference wave level correction unit 25 are installed by the number of antennas.

The synthesizing components for synthesizing the outputs from the antenna-series components in the second receiving level measuring circuit of the present invention are a desirable wave antenna synthesizing unit 26, an interference wave antenna synthesizing unit 27, and an antenna-synthesized SIR measuring unit 28.

Next, the components of this apparatus will be described more specifically. Operations of the same components as the conventional ones such as the RSSI detection unit 1, the analog-to-digital conversion unit 2, the RSSI averaging unit 3, and the voltage/dB conversion unit 4 are quite the same as those of the conventional ones, and therefore the description is omitted here and only characterizing portions of the present invention will be described specifically. Note that operations of the respective antenna-series components are the same as each other except that a received signal to be treated is a signal received at each antenna and therefore they are designated by reference numerals without -n.

The desirable/interference wave component output unit 20 inputs a received signal in the radio frequency band received at each antenna, controls a gain of the received signal by using RSSI detected by the RSSI detection unit 1, converts it to a baseband signal through a quadrature detection, detects and separates a desirable wave and an interference wave for each spread code, synthesizes a plurality of desirable wave components and a plurality of interference wave components to convert them to electricity, and outputs a desirable wave component (power) and an interference wave component (power).

A detailed internal configuration will be described later.

The antenna SIR measuring unit 21 measures a signal-to-interference ratio (SIR) for each antenna from the desirable wave component power and the interference wave component power output from the desirable/interference wave component output unit 20.

The dB conversion unit 22 dB-converts the desirable wave component power output from the desirable/interference wave component output unit 20.

The desirable wave level correction unit 23 receives inputs of the averaged RSSI dB-converted by the voltage/dB conversion unit 4, the spreading ratio of the signal spread in the spread modulation at the transmitting end, the fixed correction value for correcting the desirable wave component power measured in the receiver to an absolute power value, and the SIR value measured by the antenna SIR measuring unit 21, corrects the desirable wave component power output from the dB conversion unit 22, and outputs a desirable wave receiving level. The contents of the correction will be described later.

The dB conversion unit 24 dB-converts the interference wave component power output from the desirable/interference wave component output unit 20.

The interference wave level correction unit 25 receives inputs of the averaged RSSI dB-converted by the voltage/dB conversion unit 4, the spreading ratio of the signal spread in the spread modulation at the transmitting end, the fixed correction value for correcting the interference wave component power measured in the receiver to an absolute power value, and the SIR value measured by the antenna SIR measuring unit 21, corrects the interference wave component power output from the dB conversion unit 24, and outputs an interference wave receiving level.

The contents of correction in the desirable wave level correction unit 23 and the interference wave level correction unit 25 will be described briefly here. The details are described in Japanese Unexamined Patent Publication (Kokai) No. 285209 of 2001, titled "Receiving level measuring method and receiving level measuring circuit" (Applicant: Hitachi Kokusai Electric Inc., Inventor: Takahito Ishii).

One of the corrections in the desirable wave level correction unit 23 and the interference wave level correction unit 25 is a correction with a distinction between a case of using the desirable wave component detected in the baseband directly as a desirable wave level and a case of adding the radio unit RSSI to the desirable wave component detected in the baseband as a correction value according to the radio unit RSSI in response to a relation between the reception field and the in-band noise level and a characteristic of the desirable wave component in the baseband, thereby enabling an appropriate detection of a receiving level in the whole reception field region.

Furthermore, there is another correction of correcting the desirable wave level detected in the baseband to an absolute power. The correction comprises retaining a spreading gain acquired by a spread modulation at the transmitting end and a fixed correction value for an operation of detecting a desirable wave and an interference wave in the desirable/interference wave component output unit 20 as parameters and adding it to the desirable wave level after the correction with the radio unit RSSI to get an absolute power value of a target desirable wave level.

Note that the interference wave level correction unit 25 performs only the fixed correction, by which the level is corrected to the absolute power value.

The desirable wave antenna synthesizing unit 26 adds and synthesizes the desirable wave receiving levels output from the respective antenna-series desirable wave level correction units 23 (antenna synthesization) and outputs the antenna-synthesized desirable wave power as a desirable wave receiving level of the whole receiver. In other words, the antenna-synthesized desirable wave power is:

Antenna (1) desirable wave level (true value)+Antenna (2) desirable wave level (true value)

The interference wave antenna synthesizing unit 27 synthesizes the interference wave receiving levels output from the respective antenna-series interference wave level correction unit 25 with a weight by using the SIR values measured by the respective antenna-series antenna SIR measuring unit 21 and outputs the antenna-synthesized interference wave power as an interference wave receiving level of the whole receiver. In other words; the antenna-synthesized interference wave level is:

$(A * \text{Antenna}(1) \text{interference wave level(true value)} +$ $B * \text{Antenna}(2) \text{interference wave level(true value)})/(A + B)$ where A is SIR (true value) of antenna (1) and B is SIR (true value) of antenna (2).

The antenna-synthesized SIR measuring unit 28 dB-converts again an antenna-synthesized desirable wave receiving level from the desirable wave antenna synthesizing unit 26 and an interference wave receiving level from the interference wave antenna synthesizing unit 27, calculates SIR after the antenna synthesization, and outputs it as SIR of the entire receiver.

Operations in the second receiving level measuring circuit according to the present invention will be described with reference to FIG. 6.

In the second receiving level measuring circuit according to the present invention, in the same manner as in the conventional one, a received signal received at the antenna (1) among received signals in the radio frequency band having been input to a receiver is input to an RSSI detection unit 1-1, an RSSI of the received signal is detected and output as an analog voltage value, the analog value is converted to a digital value in an analog-to-digital conversion unit 2-1, the value is submitted to a given averaging process in an RSSI averaging unit 3-1 and then converted to a dB value in a voltage/dB conversion unit 4-1, and a result of measuring the receiving level of the received signal in the radio frequency band received at the antenna (1) is output as an RSSI dB value.

On the other hand, in a desirable/interference wave component output unit 20-1, the received signal in the radio frequency band received at the antenna (1) is gain-controlled by using the RSSI detected by the RSSI detection unit 1-1, converted to a baseband signal through quadrature detection, and separated into a desirable wave and an interference wave to output a desirable wave component (power) and an interference wave component (power), and an antenna SIR measuring unit 21-1 measures the SIR of the antenna (1) from the desirable wave component (power) and the interference wave component (power).

On the other hand, the desirable wave component (power) output from the desirable/interference wave component output unit 20-1 is dB-converted in a dB conversion unit 22-1 and corrected in a desirable wave level correction unit 23-1 by using the RSSI from the voltage/dB conversion unit 4-1, a spreading ratio and a fixed correction value, an SIR value from the antenna SIR measuring unit 21-1. Thereafter, a desirable wave receiving level of the antenna (1) is output.

In the same manner, the interference wave component (power) output from the desirable/interference wave component output unit 20-1 is dB-converted in a conversion unit 24-1 and corrected in an interference wave level correction unit 25-1 by using the RSSI from the voltage/dB conversion unit 4-1, the spreading ratio and the fixed correction value, the SIR value from the antenna SIR measuring unit 21-1. Thereafter, an interference wave receiving level of the antenna (1) is output.

Through the same operation, the received signal received at the antenna (2) is processed as follows: an RSSI in the radio frequency band received at the antenna (2) is measured in the RSSI detection unit 1-2 to the voltage/dB conversion unit 4-2, the signal is separated into a desirable wave and an interference wave in the baseband in the desirable/interference wave component output unit 20-2, and a desirable wave component (power) and an interference wave component (power) are output, dB-converted, and corrected. Thereafter, the desirable wave level correction unit 23-2 and the interference wave level correction unit 25-2 output a desirable wave receiving level and an interference wave receiving level of the antenna (2).

Subsequently, the desirable wave antenna synthesizing unit 26 synthesizes the desirable wave receiving level of the antenna (1) output from the desirable wave level correction unit 23-1 and the desirable wave receiving level of the antenna (2) output from the desirable wave level correction unit 23-2, and a desirable wave receiving level of the entire receiver is output.

In the same manner, the interference wave antenna synthesizing unit 27 synthesizes the interference wave receiving level of the antenna (1) output from the interference wave level correction unit 25-1 and the interference wave receiving level of the antenna (2) output from the interference wave level correction unit 25-2, and an interference wave receiving level of the entire receiver is output.

Thereafter, by using the desirable wave receiving level of the entire receiver form the desirable wave antenna synthesizing unit 26 and the interference wave receiving level of the entire receiver from the interference wave antenna synthesizing unit 27, the antenna-synthesized SIR measuring unit 28 calculates and outputs an SIR of the entire receiver.

FIG. 6 shows an arrangement having two antennas. In an arrangement having a plurality of antennas, the desirable wave antenna synthesizing unit 26 synthesizes all the desirable wave receiving levels output from the respective antenna-series desirable wave level correction units 23 and the interference wave antenna synthesizing unit 27 synthesizes all the interference wave receiving levels output from the respective antenna-series interference wave level correction unit 25.

Figure 7:
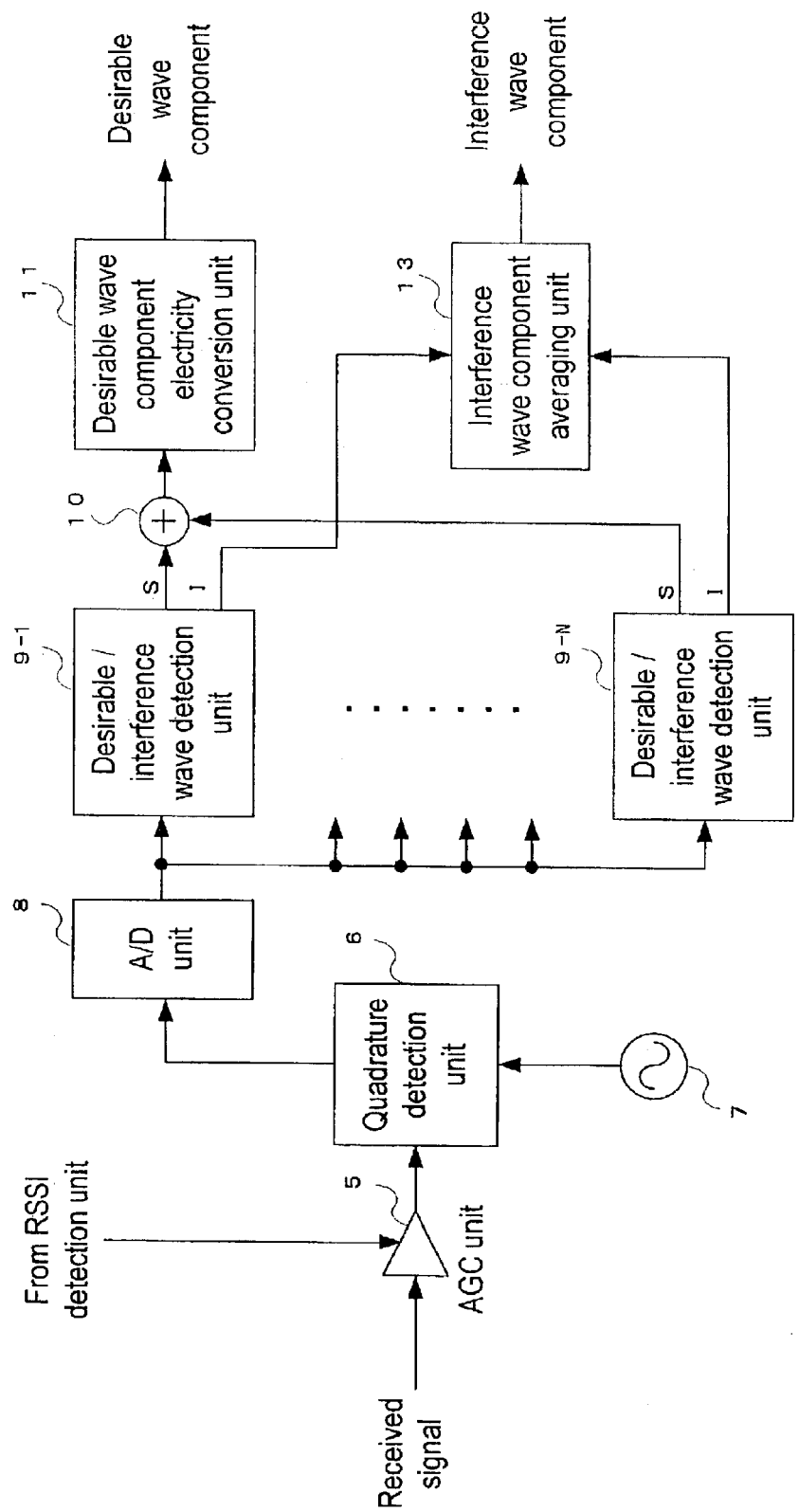
FIG. 7 is a block diagram showing an example of a first internal configuration of a desirable/interference wave component output unit of the receiving level measuring circuit according to the second embodiment of the present invention.

The following describes an example of a first internal configuration of the desirable/interference wave component output unit 20 in the second receiving level measuring circuit according to the present invention with reference to FIG. 7. Referring to FIG. 7, there is shown a block diagram showing an example of the first internal configuration in a desirable/interference wave component output unit 20 according to the present invention.

The first internal configuration (the first desirable/interference wave component output unit) of the desirable/interference wave component output unit 20 in the second receiving level measuring circuit of the present invention comprises an AGC unit 5, a quadrature detection unit 6, an oscillator 7, an A/D unit 8, a plurality of desirable/interference wave detection units 9, an adder 10, a desirable wave component electricity conversion unit 11, and an interference component averaging unit 13.

Regarding the oscillator 7 and the A/D unit 8 shown in FIG. 7, the respective antenna-series oscillators 7 and A/D units 8 can be a common oscillator and a common A/D unit.

Next, components of the first desirable/interference wave component output unit will be described specifically.

The AGC unit 5 performs an automatic gain control (AGC) to amplify (or attenuate) received power to keep it constant by using an RSSI voltage detected by the RSSI detection unit 1.

The oscillator 7 is used to output a carrier wave to the quadrature detection unit 6.

The quadrature detection unit 6 demodulates the received signal in the radio frequency band by using the carrier wave from the oscillator 7 and downconverts it to inphase and quadrature components in the baseband.

The A/D unit 8 converts the analog baseband received signal downconverted in the quadrature detection unit 6 to a digital signal.

The desirable/interference wave detection units 9 detect desirable wave components and interference wave components from the baseband received signal converted to the digital signal and a plurality of the desirable/interference wave detection units 9 are arranged for each spread code. In the DC-CDMA system, they are used to detect a desirable wave component and an interference wave component for each path with separating a multipath. In FIG. 7, S and I indicate a desirable wave component and an interference wave component, respectively.

The details of the internal configuration are described further in Japanese Unexamined Patent Publication (Kokai) No. 285209 of 2001, titled "Receiving level measuring method and receiving level measuring circuit" (Applicant: Hitachi Kokusai Electric Inc., Inventor: Takahito Ishii) and therefore they are omitted here.

The adder 10 adds and synthesizes the desirable wave components from the plurality of desirable/interference wave detection units 9.

The desirable wave component electricity conversion unit 11 converts the desirable wave components after the addition (synthesizing) output from the adder 10 into electricity.

The interference component averaging unit 13 averages interference wave components from a plurality of desirable/interference wave detection unit 9.

The adder 10, the desirable wave component electricity conversion unit 11, and the interference component averaging unit 13 operate by utilizing that the desirable wave components are synthesized through so-called rake synthesization that synthesizes respective paths separated by despreading while the interference wave components are averaged to be suppressed after synthesization since they are independent of each other on each path.

Next, an operation of the first desirable/interference wave component output unit 20 in the second receiving level measuring circuit according to the present invention will be described with reference to FIG. 7.

In the first desirable/interference wave component output unit 20 of the present invention, the received signal in the radio frequency band having been input to the receiver is controlled so that the received power is fixed by performing a gain control in the AGC unit 5 using the RSSI voltage detected in the RSSI detection unit 1. Furthermore, it is downconverted in the quadrature detection unit 6 to inphase and quadrature components in the baseband with a carrier wave from the oscillator 7. The downconverted baseband received signal is converted to a digital signal in the A/D unit 8 and input in parallel to the plurality of desirable/interference wave detection units 9.

Subsequently, each desirable/interference wave detection unit 9 detects a desirable wave component (S) and an interference wave component (I) for each spread code. In the DS-CDMA system, a multipath can be separated by despreading and therefore the separated delayed waves are allocated to the desirable/interference wave detection units 9, by which a desirable wave component (S) and an interference wave component (I) for each path are obtained.

Then, the adder 10 adds up the desirable wave components (S) from the desirable/interference wave detection units 9, by which a sum of the desirable wave components of the separated paths is calculated, the synthesized desirable wave components are obtained, and further the desirable wave component electricity conversion unit 11 converts the synthesized desirable wave components into electricity.

On the other hand, the interference component averaging unit 13 further averages the interference wave components (I) from the desirable/interference wave detection units 9 for each path.

This operation utilizes that the desirable wave components are synthesized through so-called rake synthesization that synthesizes respective paths separated by despreading while the interference wave components are averaged to be suppressed after synthesization since they are independent of each other on each path.

Figure 8:
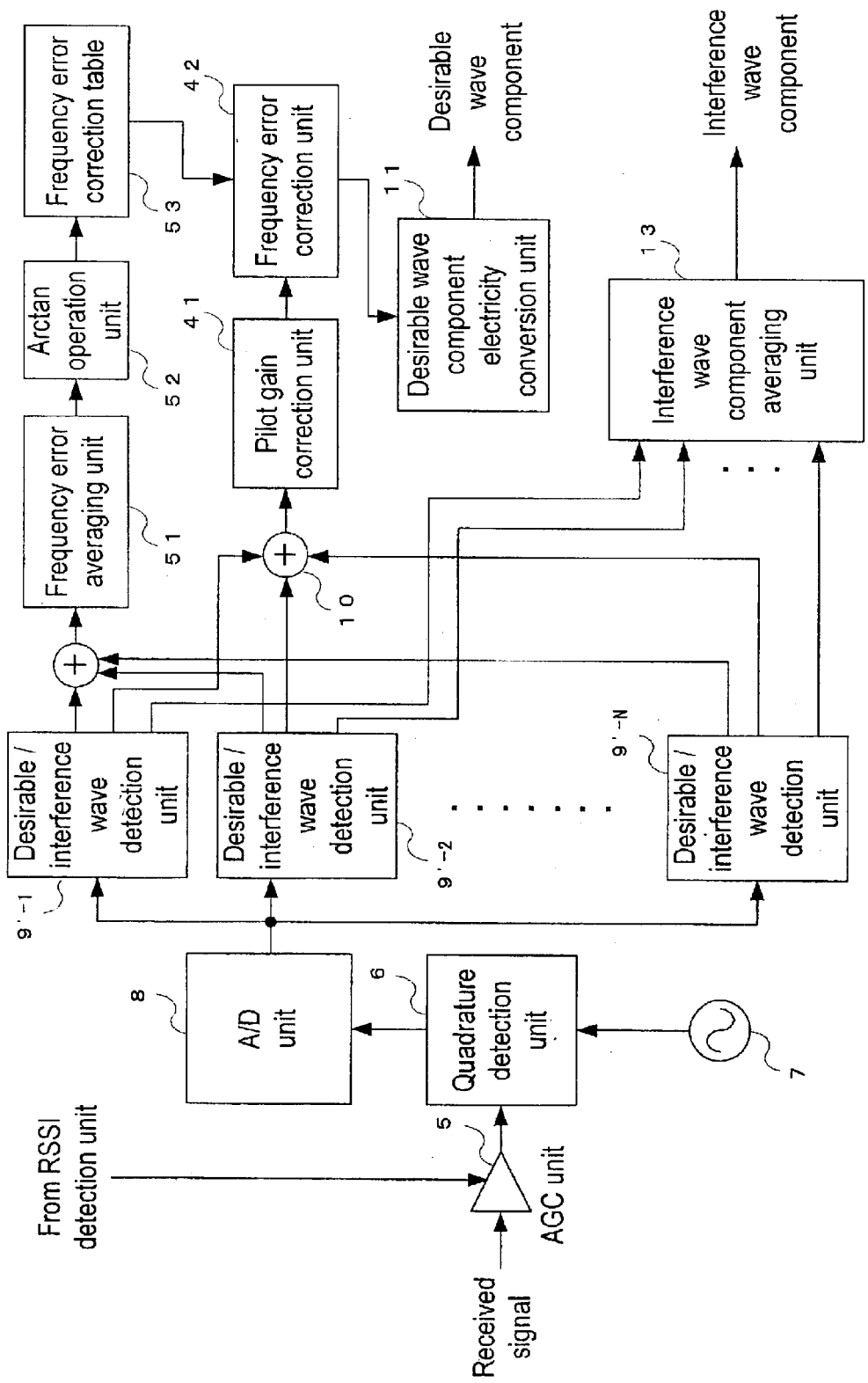
FIG. 8 is a block diagram showing an example of a second internal configuration of the desirable/interference wave component output unit of the receiving level measuring circuit according to the second embodiment of the present invention.

Next, another sample configuration (the second internal configuration) of the desirable/interference wave component output unit 20 in the second receiving level measuring circuit according to the present invention will be described with reference to FIG. 8. Referring to FIG. 8, there is shown a block diagram of the second internal configuration of the desirable/interference wave component output unit 20 of the present invention. The portions having the same configuration as in FIG. 7 are designated by identical reference numerals in the description.

The second internal configuration (the second desirable/interference wave component output unit) of the desirable/interference wave component output unit 20 in the second receiving level measuring circuit of the present invention has the same components as in the first desirable/interference wave component output unit; the AGC unit 5, the quadrature detection unit 6, the oscillator 7, the A/D unit 8, the adder 10, the desirable wave component electricity conversion unit 11, and the interference component averaging unit 13, and further has characterizing portions of the second desirable/interference wave component output unit; a plurality of desirable/interference wave detection units 9', a pilot gain correction unit 41, a frequency error correction unit 42, an adder 50, a frequency error averaging unit 51, an arctangent operation unit 52, and a frequency error correction table 53.

Next, the components of the second desirable/interference wave component output unit will be described. Only the characterizing portions will be focused on in the description by omitting description of the same components as in the first desirable/interference wave component output unit.

The desirable/interference wave detection units 9' detect frequency error vectors in addition to the desirable wave components and the interference wave components from a baseband received signal converted to a digital signal. A plurality of the desirable/interference wave detection units 9' are arranged for each spread code. In the DC-CDMA system, they are used for separating a multipath to detect a desirable wave component, an interference wave component, and a frequency error vector for each path.

Note that, however, a detailed description of the desirable/interference wave detection units 9' is omitted here since they are the same as the desirable/interference wave detection units 9 described in the receiving level measuring circuit according to the first embodiment of the present invention.

The adder 50 adds up and synthesizes the frequency error vectors from the plurality of desirable/interference wave detection units 9.

The frequency error averaging unit 51 averages the added frequency error vectors. The operation is performed since the frequency error vectors from the desirable/interference wave detection units 9 are amounts of phase rotation in one symbol duration and include amounts of phase rotation caused by fading or the like and therefore the frequency error averaging unit 51 averages the frequency error vectors for a long period of time to eliminate the components of phase rotation caused by fading so that they are detected as fixed amounts of phase rotation caused by frequency errors.

The arctangent operation unit (shown as arctan operation unit) 52 makes an arctan operation for the averaged frequency error vector to perform a unit conversion for the frequency error (Hz). More specifically, the arctan operation is made for the averaged frequency error vector to calculate $\Delta\theta$ and further to calculate the frequency error (Hz) from one symbol time length before the unit conversion.

The frequency error correction table 53, which includes a correction table where correction values corresponding to frequency errors are stored in a table format, receives an input of a frequency error (Hz) output from the arctangent operation unit 52 and outputs its corresponding correction value. The details of the correction table are the same as those in the first embodiment.

The adder 10 adds and synthesizes the desirable wave components output from the plurality of desirable/interference wave detection units 9'.

The pilot gain correction unit 41 corrects an offset of a pilot symbol portion added at the transmitting end. In other words, considering a case where the pilot symbol portion is sent with a power offset added to the power of the data symbol portion (a pilot gain) at the transmitting end, the pilot gain correction unit 41 corrects the offset of the pilot gain. For example, if the pilot symbol is sent with a half power for the data symbol, the pilot gain correction unit 41 corrects the pilot gain by multiplying the synthesized desirable wave component by $\sqrt{2}$.

The frequency error correction unit 42 corrects a frequency error using a frequency error correction value output from the frequency error correction table 53 for the desirable wave component, whose pilot gain was corrected after the addition.

Next, an operation of the second desirable/interference wave component output unit 20 in the second receiving level measuring circuit of the present invention will be described with reference to FIG. 8.

In the second desirable/interference wave component output unit 20 of the present invention, like the first desirable/interference wave component output unit 20, the received signal in the radio frequency band having been input to the receiver is controlled so that the received power is fixed by performing a gain control in the AGC unit 5 using the RSSI voltage detected in the RSSI detection unit 1. Furthermore, it is downconverted in the quadrature detection unit 6 to inphase and quadrature components in the baseband with a carrier wave from the oscillator 7. The downconverted baseband received signal is converted to a digital signal in the A/D unit 8 and input in parallel to the plurality of desirable/interference wave detection units 9'.

Subsequently, as described in the first embodiment, each desirable/interference wave detection unit 9' detects a desirable wave component (S), an interference wave component (I) for each spread code, and an amount of phase rotation in one symbol duration as a frequency error vector.

In the DS-CDMA system, a multipath can be separated by despreading and therefore the separated delayed waves are allocated to the desirable/interference wave detection units 9', by which a desirable wave component (S), an interference wave component (I), and a frequency error vector for each path are obtained.

Then, the adder 10 adds up the desirable wave components (S) from the desirable/interference wave detection units 9', by which a sum of the desirable wave components of the separated paths is calculated and the synthesized desirable wave components are obtained.

As one of the characteristics of the second desirable/interference wave component output unit 20, the synthesized desirable wave component undergoes a correction of the pilot gain added at the transmitting end in the pilot gain correction unit 41.

Further as the second characteristic of the second desirable/interference wave component output unit 20, a frequency error is corrected for the synthesized desirable wave component after the pilot gain correction.

To be more precise, the adder 50 adds up the frequency error vectors output from the desirable/interference wave detection units 9', by which the frequency error vectors after the synthesization are obtained, and further the frequency error averaging unit 51 averages the frequency error vectors for a long interval, thereby eliminating the components of phase rotation caused by fading, and they are detected as fixed amounts of phase rotation caused by frequency errors.

Subsequently, the arctangent operation unit 52 performs an arctan operation for the averaged frequency error vector to calculate a frequency error (Hz), thereby getting a correction value corresponding to the frequency error on the frequency error correction table 53.

On the frequency error correction table 53, the correction value corresponding to the frequency error from the arctangent operation unit 52 is output to the frequency error correction unit 42.

Subsequently, the correction value obtained correspondingly to the frequency error on the frequency error correction table 53 is output to the frequency error correction unit 42, in which the correction value is multiplied by the synthesized desirable wave component vector from the pilot gain correction unit 41 for correction, and further the desirable wave component electricity conversion unit 11 converts the corrected desirable wave component into electricity and outputs it as a desirable wave component (power).

On the other hand, regarding the interference wave component (I), the interference wave components ([Eq. 3]) of respective paths are further averaged by the interference component averaging unit 13 and the value is output as an interference wave component (power).

This operation utilizes that the desirable wave components are synthesized through so-called rake synthesization that synthesizes respective paths separated by despreading while the interference wave components are averaged to be suppressed after synthesization since they are independent of each other on each path.

The receiving level measuring circuit set forth above can be a digital signal processor (DSP).

According to the receiving level measuring circuit of the second embodiment of the present invention, for received signals received at a plurality of antennas, respective desirable wave levels and interference wave levels are obtained by respective antenna-series components, the desirable wave antenna synthesizing unit 26 adds and synthesizes desirable wave components obtained at the respective antenna-series components and outputs a desirable wave receiving level of the receiver, the interference wave antenna synthesizing unit 27 synthesizes the interference wave components obtained by the respective antenna-series components with a weight by using respective antenna-series SIR values and outputs an interference wave receiving level of the receiver, and an SIR is further obtained by using the synthesized desirable wave receiving level of the receiver and the synthesized interference wave receiving level of the receiver to output a synthesized SIR value of the receiver, thereby generating an effect of adapting to a receiver having a plurality of antennas (branches).

In addition, according to the receiving level measuring circuit of the second embodiment of the present invention, for received signals received at a plurality of antennas, the RSSI detection unit 1 to the voltage/dB conversion unit 4 measure RSSI in the radio frequency band, the desirable/interference wave component output unit 20 separates the desirable wave component from the interference wave component and detects their levels from the baseband signal, the desirable wave level correction unit 23 uses the desirable wave level concerned directly at a reception field strength level lower than or equal to the in-band noise or corrects the desirable wave level by adding a reception field strength detected in the radio unit to the desirable wave level and outputs it as a desirable wave receiving level at a reception field strength level more than the in-band noise, by which the desirable wave levels can be measured by the respective antenna-series components up to a level lower than or equal to the in-band noise of the receiver radio unit, thereby generating an effect of achieving a receiving level measuring circuit having high accuracy.

Furthermore, according to the second receiving level measuring circuit of the present invention, if the desirable wave level correction unit 23 adds the radio unit RSSI to the desirable wave level for the correction to consider the value to be a result of measuring the receiving level for a level more than the in-band noise as described above, the SIR measuring unit 43 measures the signal-to-interference ratio (SIR) and the desirable wave level correction unit 12 determines whether the correction with RSSI added should be performed using the SIR as a threshold so as to prevent an inappropriate correction from being made despite of no desirable wave exists in the received signal, thereby generating effects of preventing an inappropriate correction under such a condition that no desirable wave exists and improving measuring accuracy of the desirable wave component.

Still further, in the receiving level measuring circuit according to the second embodiment of the present invention, in the first configuration of the desirable/interference wave component output unit 20, the received signal is gain-controlled by using the radio unit RSSI, converted to a baseband signal in the quadrature detection unit 6, and separated into a desirable wave and an interference wave by their detection with the desirable/interference wave detection unit 9 for each spread code, and they are synthesized or averaged, by which it is possible to measure the desirable wave level and the interference wave level separately and to get a desirable wave component level without unnecessary interference wave component included in the received wave as a receiving level, thereby generating an effect of acquiring more accurate desirable wave component.

Furthermore, each desirable/interference wave detection unit 9 separates a multipath by despreading to detect a desirable wave component and an interference wave component for each path from the separated delayed wave, the adder 10 synthesizes the desirable wave components detected by the desirable/interference wave detection units 9, and the interference component averaging unit 13 averages the interference wave components, which leads to performing so-called rake synthesization that synthesizes paths separated by despreading, thereby generating an effect of getting more accurate desirable wave and interference wave values.

Still further, in the receiving level measuring circuit according to the second embodiment of the present invention, in the second configuration of the desirable/interference wave component output unit 20, in addition to the first configuration, the desirable/interference wave detection units 9' obtain amounts of phase rotation between symbols as frequency error vectors and the frequency error correction unit 42 corrects the desirable wave component vectors by using a previously stored correction value corresponding to the frequency error in order to correct phase rotation caused by a frequency error between an oscillator at the transmitting end and an oscillator at the receiving end, thereby generating an effect of improving measuring accuracy of the desirable wave component.

Furthermore, in the second configuration of the desirable/interference-wave component output unit 20, since the frequency error vectors detected by the desirable/interference wave detection units 9' include the amounts of phase rotation caused by fading or the like, the adder 50 synthesizes the frequency error vectors from the desirable/interference wave detection units 9' and then the frequency error averaging unit 51 averages the frequency error vectors for a long interval to eliminate the components of the phase rotation caused by fading, so that they are detected as fixed amounts of phase rotation caused by frequency errors, thereby generating effects of improving correcting accuracy of the frequency error and improving measuring accuracy of the desirable wave components.

Still further, in the second configuration of the desirable/interference wave component output unit 20, in order to correct an offset (a pilot gain) of the pilot symbol portion added at the transmitting end, the pilot gain correction unit 41 corrects the synthesized desirable wave components according to the pilot gain added at the transmitting end, by which the desirable wave receiving level measured using the pilot symbol can be more approximated to the desirable wave receiving level of the data symbol, thereby generating an effect of improving accuracy of the desirable wave receiving level.

According to the present invention, there is provided a receiving level measuring circuit, comprising: desirable/interference wave detection means for detecting a plurality of desirable wave components, a plurality of interference wave components, and a plurality of frequency error vectors from the received signal submitted to the quadrature detection, frequency error correction-value acquisition means for previously storing a correction value corresponding to the frequency error and then adding and averaging the plurality of frequency error vectors detected by the desirable/interference wave detection means so as to get the correction value corresponding to the frequency error submitted to a unit conversion, and frequency error correction means for adding up the plurality of desirable wave components detected by the desirable/interference wave detection means and for correcting the desirable wave components using the correction value, thereby generating effects of correcting the phase rotation caused by a frequency error of oscillators included in the transmitter and receiver and improving measuring accuracy of the desirable wave receiving level.

Furthermore, according to the present invention, the above receiving level measuring circuit, further comprises signal-to-interference ratio (SIR) measuring means for getting a signal-to-interference ratio (SIR) based on the interference wave receiving level and the desirable wave power level, wherein, in a case that the detected field strength exceeds a specific value in the correction with reference to the specific value in the desirable wave level correction means, the desirable wave level correction means makes a correction by adding the detected field strength level to the desirable wave power level if the SIR is more than zero, but does not make the correction of adding the detected field strength level to the desirable wave power level if the SIR is zero or less, thereby improving measuring accuracy of the desirable wave components by preventing inappropriate correction when no desirable wave exists.

According to the present invention, there is provided a receiving level measuring circuit, comprising for each antenna: received signal strength indicator (RSSI) detection means for detecting a field strength of a received signal, desirable/interference wave component power output means for converting the received signal to a baseband signal, detecting a desirable wave and an interference wave for separation, and outputting a desirable wave power level and an interference wave power level, signal-to-interference ratio (SIR) measuring means for getting a signal-to-interference ratio (SIR) from the desirable wave power level and the interference wave power level, desirable wave level correction means for outputting the desirable wave power level as a desirable wave receiving level if the detected field strength is lower than or equal to a predetermined specific value or for making a correction of adding the detected field strength level to the desirable wave power level and a correction using a spreading ratio and a fixed correction value and outputting the corrected level as a desirable wave receiving level, and interference wave level correction means for correcting the interference wave power level using a spreading ratio and a fixed correction value and outputting the corrected value as an interference wave receiving level, and having desirable wave antenna synthesizing means for synthesizing desirable wave receiving levels output from the desirable wave level correction means for each antenna and outputting the synthesized desirable wave receiving level, interference wave antenna synthesizing means for synthesizing the interference wave receiving levels output from the interference wave level correction means for each antenna with weighting by using the SIRs in the corresponding antennas and outputting the synthesized interference wave receiving level, and synthesized SIR measuring means for getting a synthesized SIR from the synthesized desirable wave receiving level and the synthesized interference wave receiving level, thereby enabling a measurement of a receiving level up to a level lower than or equal to an in-band noise in a receiver radio unit, adapting to a receiver configuration having a plurality of antennas (branches).

In the above receiving level measuring circuit according to the present invention, the desirable/interference wave component power output means comprises quadrature detection means for performing a quadrature detection of the received signal and converting it to a baseband signal, desirable/interference wave detection means for detecting a plurality of desirable wave components and a plurality of interference wave components from the baseband received signal submitted to the quadrature detection, desirable wave component electricity conversion means for adding up the detected plurality of desirable wave components, converting the resultant value into electricity, and outputting a desirable wave power level, and interference wave component averaging means for averaging the detected plurality of interference wave components and outputting an interference wave power level, thereby enabling a measurement of a receiving level up to a level lower than or equal to the in-band noise in the receiver radio unit so as to adapt to the receiver configuration having a plurality of antennas (branches) and getting very accurate values on both of the desirable wave and the interference wave.

In the above receiving level measuring circuit according to the present invention, the desirable/interference wave component power output means comprises quadrature detection means for performing a quadrature detection of the received signal and converting it to a baseband signal, desirable/interference wave detection means for detecting a plurality of desirable wave components, a plurality of interference wave components, and a plurality of frequency error vectors from the baseband received signal submitted to the quadrature detection, frequency error correction-value acquisition means for previously storing a correction value corresponding to the frequency error and then adding and averaging the detected plurality of frequency error vectors so as to get a correction value corresponding to the frequency error submitted to a unit conversion, frequency error correction means for adding up the detected plurality of desirable wave components and correcting the desirable wave components using a correction value, desirable wave component electricity conversion means for converting the corrected desirable wave components into electricity to obtain a desirable wave power level, and interference wave component averaging means for averaging the detected plurality of interference wave components and outputting an interference wave power level, thereby enabling a measurement of a receiving level up to a level lower than or equal to the in-band noise in the receiver radio unit so as to adapt to the receiver configuration having a plurality of antennas (branches), getting very accurate values on both of the desirable wave and the interference wave, and further improving measuring accuracy of the desirable wave receiving level by correcting phase rotation caused by a frequency error between oscillators included in a transmitter and a receiver.

What is claimed is:

1. A receiving level measuring circuit, comprising:
    received signal strength indicator (RSSI) detection means for detecting field strength of a received signal;
    quadrature detection means for performing a quadrature detection of the received signal;
    desirable/interference wave detection means for detecting a plurality of desirable wave components, a plurality of interference wave components, and a plurality of frequency error vectors from the received signal submitted to the quadrature detection;
    frequency error correction-value acquisition means for previously storing a correction value corresponding to the frequency error and then adding and averaging the detected plurality of frequency error vectors so as to get the correction value corresponding to the frequency error submitted to a unit conversion;
    frequency error correction means for adding up the detected plurality of desirable wave components and for correcting the desirable wave components using the correction value;
    desirable wave component electricity conversion means for converting the corrected desirable wave components into electricity to get a desirable wave power level; and
    desirable wave level correction means for outputting the desirable wave power level as a desirable wave receiving level if the detected field strength is lower than or equal to a predetermined specific value or for correcting the desirable wave power level by adding the detected field strength level to the desirable wave power level and then outputting the corrected level as a desirable wave receiving level if the detected field strength is more than the specific value.

2. The circuit according to claim 1, further comprising interference wave component averaging means for averaging the plurality of interference wave components detected by said desirable/interference wave detection means and then outputting an interference wave receiving level; and
    signal-to-interference ratio (SIR) measuring means for getting a signal-to-interference ratio (SIR) based on the interference wave receiving level from said interference wave component averaging means and on the desirable wave power level,
    wherein, in a case that the detected field strength exceeds the specific value in the correction with reference to the specific value in the desirable wave level correction means, the desirable wave level correction means makes a correction of adding the detected field strength level to the desirable wave power level if the SIR is more than zero, but does not make the correction of adding the detected field strength level to the desirable wave power level if the SIR is zero or less.

3. The circuit according to claim 2, wherein said desirable/interference wave detection means comprises:
    a code generation unit for generating a referential spread code;
    a despreading unit for despreading by performing a correlation operation between the baseband received signal converted to a digital signal and the referential code output from said code generation unit;
    a digital AGC unit for upshifting the signal after the despreading according to a spreading ratio of the transmitting party;
    a referential pilot symbol generation unit for generating the referential pilot symbol;
    a complex multiplier for performing a complex conjugate multiplication between the signal from the digital AGC unit and the referential pilot symbol, getting an amplitude phase variation, and considering it to be a desirable wave component vector;
    a delayed device for delaying the desirable wave component vector by one symbol duration;
    a complex multiplier for performing a complex multiplication between the desirable wave component vector at an arbitrary symbol and a desirable wave component vector delayed by one symbol from said delay device, getting an amount of phase rotation in one symbol duration, and outputting it as a frequency error vector;
    a desirable wave component averaging unit for averaging the desirable wave vector;
    an adder for obtaining a difference between the averaged desirable wave vector and the desirable wave vector before the averaging and outputting it as an interference wave component vector;
    a vector/scalar conversion unit for converting the desirable wave component vector from said desirable wave component averaging unit to a scalar and outputting it as a desirable wave component;
    an interference wave component electricity conversion unit for calculating power of the interference wave component vector from said adder; and
    an index weighting averaging unit for averaging the electricity-converted interference wave component with index weighting and outputting it as an interference wave component.

4. The circuit according to claim 1, wherein said desirable/interference wave detection means comprises:
    a code generation unit for generating a referential spread code;
    a despreading unit for despreading by performing a correlation operation between the baseband received signal converted to a digital signal and the referential code output from said code generation unit;
    a digital AGC unit for upshifting the signal after the despreading according to a spreading ratio of the transmitting party;
    a referential pilot symbol generation unit for generating the referential pilot symbol;
    a complex multiplier for performing a complex conjugate multiplication between the signal from the digital AGC unit and the referential pilot symbol, getting an amplitude phase variation, and considering it to be a desirable wave component vector;
    a delayed device for delaying the desirable wave component vector by one symbol duration;
    a complex multiplier for performing a complex multiplication between the desirable wave component vector at an arbitrary symbol and a desirable wave component vector delayed by one symbol from said delay device, getting an amount of phase rotation in one symbol duration, and outputting it as a frequency error vector;

a desirable wave component averaging unit for averaging the desirable wave vector;

an adder for obtaining a difference between the averaged desirable wave vector and the desirable wave vector before the averaging and outputting it as an interference wave component vector;

a vector/scalar conversion unit for converting the desirable wave component vector from said desirable wave component averaging unit to a scalar and outputting it as a desirable wave component;

an interference wave component electricity conversion unit for calculating power of the interference wave component vector from said adder; and an index weighting averaging unit for averaging the electricity-converted interference wave component with index weighting and outputting it as an interference wave component.

5. A receiving level measuring circuit for measuring a receiving level of a received signal received at a plurality of antennas, comprising for each antenna:

received signal strength indicator (RSSI) detection means for detecting field strength of the received signal;

desirable/interference wave component power output means for converting the received signal to a baseband signal, detecting a desirable wave and an interference wave for separation, and outputting a desirable wave power level and an interference wave power level;

signal-to-interference ratio (SIR) measuring means for getting a signal-to-interference ratio (SIR) from the desirable wave power level and the interference wave power level;

desirable wave level correction means for outputting the desirable wave power level as a desirable wave receiving level if the detected field strength is lower than or equal to a predetermined specific value or for making a correction of adding the detected field strength level to the desirable wave power level and a correction using a spreading ratio and a fixed correction value and then outputting the corrected level as a desirable wave receiving level; and interference wave level correction means for correcting the interference wave power level using a spreading ratio and a fixed correction value and outputting the corrected value as an interference wave receiving level, and comprising:

desirable wave antenna synthesizing means for synthesizing desirable wave receiving levels output from said desirable wave level correction means for each antenna and outputting the synthesized desirable wave receiving level;

interference wave antenna synthesizing means for synthesizing the interference wave receiving levels output from the interference wave level correction means for each antenna with weighting by using the SIRs in the corresponding antennas and outputting the synthesized interference wave receiving level; and synthesized SIR measuring means for getting a synthesized SIR from the synthesized desirable wave receiving level and the synthesized interference wave receiving level.

6. The circuit according to claim 5, wherein said desirable/interference wave component power output means comprises:

quadrature detection means for performing a quadrature detection of the received signal and converting it to a baseband signal;

desirable/interference wave detection means for detecting a plurality of desirable wave components and a plurality of interference wave components from the baseband received signal submitted to the quadrature detection;

desirable wave component electricity conversion means for adding the detected plurality of desirable wave components, converting them into electricity, and outputting a desirable wave power level; and interference wave component averaging means for averaging the detected plurality of interference wave components and outputting an interference wave power level.

7. The circuit according to claim 6, wherein said desirable/interference wave detection means comprises:

a code generation unit for generating a referential spread code;

a despreading unit for despreading by performing a correlation operation between the baseband received signal converted to a digital signal and the referential code output from said code generation unit;

a digital AGC unit for upshifting the signal after the despreading according to a spreading ratio of the transmitting party;

a referential pilot symbol generation unit for generating the referential pilot symbol;

a complex multiplier for performing a complex conjugate multiplication between the signal from the digital AGC unit and the referential pilot symbol, getting an amplitude phase variation, and considering it to be a desirable wave component vector;

a delayed device for delaying the desirable wave component vector by one symbol duration;

a complex multiplier for performing a complex multiplication between the desirable wave component vector at an arbitrary symbol and a desirable wave component vector delayed by one symbol from said delay device, getting an amount of phase rotation in one symbol duration, and outputting it as a frequency error vector;

a desirable wave component averaging unit for averaging the desirable wave vector;

an adder for obtaining a difference between the averaged desirable wave vector and the desirable wave vector before the averaging and outputting it as an interference wave component vector;

a vector/scalar conversion unit for converting the desirable wave component vector from said desirable wave component averaging unit to a scalar and outputting it as a desirable wave component;

an interference wave component electricity conversion unit for calculating power of the interference wave component vector from said adder; and an index weighting averaging unit for averaging the electricity-converted interference wave component with index weighting and outputting it as an interference wave component.

8. The circuit according to claim 5, wherein said desirable/interference wave component power output means comprises:

quadrature detection means for performing a quadrature detection of the received signal and converting it to a baseband signal;

desirable/interference wave detection means for detecting a plurality of desirable wave components, a plurality of interference wave components, and a plurality of frequency error vectors from the baseband received signal submitted to the quadrature detection;

frequency error correction-value acquisition means for previously storing a correction value corresponding to the frequency error and then adding and averaging the detected plurality of frequency error vectors so as to get a correction value corresponding to the frequency error submitted to a unit conversion;

frequency error correction means for adding the detected plurality of desirable wave components and correcting the desirable wave components using the correction value;

desirable wave component electricity conversion means for converting the corrected desirable wave components into electricity to obtain a desirable wave power level; and interference wave component averaging means for averaging the detected plurality of interference wave components and outputting an interference wave power level.

9. The circuit according to claim 8, wherein said desirable/interference wave detection means comprises:

a code generation unit for generating a referential spread code;

a despreading unit for despreading by performing a correlation operation between the baseband received signal converted to a digital signal and the referential code output from said code generation unit;

a digital AGC unit for upshifting the signal after the despreading according to a spreading ratio of the transmitting party;

a referential pilot symbol generation unit for generating the referential pilot symbol;

a complex multiplier for performing a complex conjugate multiplication between the signal from the digital AGC unit and the referential pilot symbol, getting an amplitude phase variation, and considering it to be a desirable wave component vector;

a delayed device for delaying the desirable wave component vector by one symbol duration;

a complex multiplier for performing a complex multiplication between the desirable wave component vector at an arbitrary symbol and a desirable wave component vector delayed by one symbol from said delay device, getting an amount of phase rotation in one symbol duration, and outputting it as a frequency error vector;

a desirable wave component averaging unit for averaging the desirable wave vector;

an adder for obtaining a difference between the averaged desirable wave vector and the desirable wave vector before the averaging and outputting it as an interference wave component vector;

a vector/scalar conversion unit for converting the desirable wave component vector from said desirable wave component averaging unit to a scalar and outputting it as a desirable wave component;

an interference wave component electricity conversion unit for calculating power of the interference wave component vector from said adder; and an index weighting averaging unit for averaging the electricity-converted interference wave component with index weighting and outputting it as an interference wave component.

* * * * *